United States Patent
Hsu et al.

(10) Patent No.: US 10,824,260 B1
(45) Date of Patent: Nov. 3, 2020

(54) TOUCH DISPLAY APPARATUS

(71) Applicant: Au Optronics Corporation, Hsinchu (TW)

(72) Inventors: Ya-Ling Hsu, New Taipei (TW); Ti-Kuei Yu, Hsinchu (TW); Hung-Chia Liao, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/677,628

(22) Filed: Nov. 7, 2019

(30) Foreign Application Priority Data

Apr. 24, 2019 (TW) ............... 108114313 A

(51) Int. Cl.
*G06F 3/041* (2006.01)
*H01L 27/32* (2006.01)
*G06F 3/047* (2006.01)

(52) U.S. Cl.
CPC ........... *G06F 3/0412* (2013.01); *G06F 3/047* (2013.01); *H01L 27/322* (2013.01); *H01L 27/3276* (2013.01); *G06F 2203/04103* (2013.01)

(58) Field of Classification Search
CPC ..... G06F 3/0412; G06F 3/047; H01L 27/322; H01L 27/3276; H01L 2203/04103
See application file for complete search history.

(56) References Cited

U.S. PATENT DOCUMENTS

| | | | |
|---|---|---|---|
| 9,489,090 B2 | 11/2016 | Ho et al. | |
| 9,529,483 B2 | 12/2016 | Qin et al. | |
| 9,785,005 B2 | 10/2017 | Yeh et al. | |
| 9,939,938 B2 | 4/2018 | Qin et al. | |
| 2008/0074401 A1 | 3/2008 | Chung et al. | |
| 2013/0038571 A1 | 2/2013 | Ho et al. | |
| 2013/0300952 A1 | 11/2013 | Yeh et al. | |
| 2014/0362304 A1* | 12/2014 | Wang ................... | G06F 3/0412 349/12 |
| 2016/0026285 A1 | 1/2016 | Qin et al. | |
| 2016/0041664 A1 | 2/2016 | Qin et al. | |
| 2016/0116779 A1 | 4/2016 | Yeh et al. | |

(Continued)

FOREIGN PATENT DOCUMENTS

CN 102749747 10/2012
CN 102929454 2/2013

(Continued)

*Primary Examiner* — Dmitriy Bolotin
(74) *Attorney, Agent, or Firm* — JCIPRNET

(57) ABSTRACT

A touch display apparatus comprises a first substrate, a second substrate, a display medium, pixel structures, touch structures and a dielectric layer. The outer surface of the first substrate is a touch surface. The plurality of pixel structures are arranged between the first substrate and the display medium or between the second substrate and the display medium. Each of the pixel structures comprises a data line, a first scan line, a first transistor and a pixel electrode. Each of the touch structures comprises a second transistor, a read-out line, a second scan line and a first touch electrode. The first touch electrode and the second transistor are arranged on an inner surface of the first substrate. The first touch electrode is arranged between the first substrate and the dielectric layer. The dielectric layer is arranged between the first touch electrode and a first transistor of a pixel structure.

26 Claims, 21 Drawing Sheets

(56) References Cited

U.S. PATENT DOCUMENTS

| | | | |
|---|---|---|---|
| 2016/0188083 A1* | 6/2016 | Shi | G06F 3/044 |
| | | | 345/174 |
| 2017/0075452 A1* | 3/2017 | Kim | G06F 3/0443 |
| 2018/0095318 A1* | 4/2018 | Pyo | G06F 3/044 |
| 2018/0356924 A1 | 12/2018 | Hsieh et al. | |

FOREIGN PATENT DOCUMENTS

| | | |
|---|---|---|
| CN | 102967976 | 3/2013 |
| CN | 103176658 | 6/2013 |
| CN | 104166489 | 11/2014 |
| CN | 104808375 | 7/2015 |
| CN | 105183220 | 12/2015 |
| WO | 2015089965 | 6/2015 |

* cited by examiner

TOUCH DISPLAY APPARATUS

CROSS-REFERENCE TO RELATED APPLICATION

This application claims the priority benefit of Taiwan application serial no. 108114313, filed on Apr. 24, 2019. The entirety of the above-mentioned patent application is hereby incorporated by reference herein and made a part of this specification.

BACKGROUND OF THE DISCLOSURE

1. Field of the Disclosure

The present disclosure relates to a display apparatus, and particularly relates to a touch display apparatus.

2. Description of Related Art

In general, touch display apparatuses comprise an out-cell touch display apparatus, an on-cell touch display apparatus and an in-cell touch display apparatus. The in-cell touch display apparatus is a touch display panel with high integration and small thickness at present, and a touch electrode is fabricated in the display panel. However, how to integrate the touch electrode into the display panel and achieve good display and touch effects is actually a major issue.

SUMMARY OF THE DISCLOSURE

The present disclosure is directed to a touch display apparatus having good display and touch properties.

The touch display apparatus of the present disclosure comprises a first substrate, a second substrate, a display medium, a plurality of pixel structures, a first touch electrode, a second transistor, a read-out line, a second scan line and a dielectric layer. The first substrate is provided with an outer surface and an inner surface which are opposite to each other, wherein the outer surface is a touch surface. The second substrate is arranged opposite to the first substrate. The display medium is arranged between the inner surface of the first substrate and the second substrate. The plurality of pixel structures are arranged between the first substrate and the display medium or between the second substrate and the display medium. Each of the pixel structures comprises a data line, a first scan line, a first transistor and a pixel electrode. The first transistor is provided with a first end, a second end and a control end. The data line is electrically connected to the first end of the first transistor. The first scan line is electrically connected to the control end of the first transistor. The pixel electrode is electrically connected to the second end of the first transistor. The first touch electrode is arranged on the inner surface of the first substrate. The second transistor is arranged on the inner surface of the first substrate and is provided with a first end, a second end and a control end. The read-out line and the second scan line are arranged on the inner surface of the first substrate. The read-out line is electrically connected to the first end of the second transistor. The second scan line is electrically connected to the control end of the second transistor. The first touch electrode is electrically connected to the second end of the second transistor. The first touch electrode is overlapped with the pixel electrode of the first pixel structure of the plurality of pixel structures. The first touch electrode is arranged between the first substrate and the dielectric layer, and the dielectric layer is arranged between the first touch electrode and the first transistor of the first pixel structure.

In an embodiment of the present disclosure, the dielectric layer is arranged on the first touch electrode, and the first transistor of the first pixel structure is arranged on the dielectric layer.

In an embodiment of the present disclosure, the dielectric layer is arranged on the first touch electrode, and the second transistor is arranged on the dielectric layer.

In an embodiment of the present disclosure, the touch display apparatus further comprises a first connecting pattern electrically connected to the second end of the second transistor, wherein the first connecting pattern is electrically connected to the first touch electrode through a contact of the dielectric layer.

In an embodiment of the present disclosure, the touch display apparatus further comprises an insulating layer arranged on the second transistor, wherein the first connecting pattern is arranged on the insulating layer and is electrically connected to the first touch electrode through a contact of the insulating layer.

In an embodiment of the present disclosure, the touch display apparatus further comprises a color filter layer arranged on the dielectric layer and the second transistor, wherein the first connecting pattern is arranged on the color filter layer and is electrically connected to the first touch electrode through a contact of the color filter layer.

In an embodiment of the present disclosure, the material of the first connecting pattern is the same as the material of the pixel electrode of the first pixel structure.

In an embodiment of the present disclosure, the dielectric layer is arranged on the read-out line. The touch display apparatus further comprises a second connecting pattern arranged on the dielectric layer, electrically connected to the second end of the second transistor, and electrically connected to the read-out line through a contact of the dielectric layer.

In an embodiment of the present disclosure, the touch display apparatus further comprises an insulating layer arranged on the dielectric layer and the second transistor, wherein the second connecting pattern is arranged on the insulating layer and is electrically connected to the read-out line through a contact of the insulating layer.

In an embodiment of the present disclosure, the touch display apparatus further comprises a color filter layer arranged on the dielectric layer and the second transistor, wherein the second connecting pattern is arranged on the color filter layer and is electrically connected to the read-out line through a contact of the color filter layer.

In an embodiment of the present disclosure, the material of the second connecting pattern is the same as the material of the pixel electrode of the first pixel structure.

In an embodiment of the present disclosure, the data line of the first pixel structure and the read-out line are arranged in a first direction, the first scan line of the first pixel structure and the second scan line are arranged in a second direction, and the first direction and the second direction are staggered.

In an embodiment of the present disclosure, the data line of the first pixel structure is substantially parallel to the read-out line.

In an embodiment of the present disclosure, the first scan line of the first pixel structure is substantially parallel to the second scan line.

In an embodiment of the present disclosure, the read-out line spans the central part of the pixel electrode of the first pixel structure.

In an embodiment of the present disclosure, the pixel electrode of the first pixel structure comprises a first main part, a second main part and a plurality of branch parts, the first main part and the second main part are staggered, the plurality of branch parts are connected to the first main part and the second main part, and the read-out line is overlapped with the first main part of the pixel electrode.

In an embodiment of the present disclosure, the vertical projection of the first scan line of the first pixel structure on the first substrate and the vertical projection of the second scan line on the first substrate are respectively positioned at two opposite sides of the vertical projection of the pixel electrode of the first pixel structure on the first substrate.

In an embodiment of the present disclosure, the touch display apparatus further comprises a second touch electrode arranged on the inner surface of the first substrate. The plurality of pixel structures comprise a second pixel structure. The second touch electrode is overlapped with the pixel electrode of the second pixel structure. The second touch electrode is arranged between the first substrate and the dielectric layer. The dielectric layer is arranged between the second touch electrode and the first transistor of the first pixel structure. The second touch electrode is electrically connected to the second scan line.

In an embodiment of the present disclosure, the touch display apparatus further comprises a third connecting pattern electrically connected to the second scan line, wherein the third connecting pattern is electrically connected to the second touch electrode through a contact of the dielectric layer.

In an embodiment of the present disclosure, the touch display apparatus further comprises an insulating layer arranged on the dielectric layer and the second transistor, wherein the third connecting pattern is arranged on the insulating layer and is electrically connected to the second touch electrode through a contact of the insulating layer.

In an embodiment of the present disclosure, the material of the third connecting pattern is the same as the material of the pixel electrode of the first pixel structure.

In an embodiment of the present disclosure, the touch display apparatus further comprises a second touch electrode and a control line. The second touch electrode is arranged on the inner surface of the first substrate. The plurality of pixel structures comprise a second pixel structure. The second touch electrode is overlapped with the pixel electrode of the second pixel structure. The second touch electrode is arranged between the first substrate and the dielectric layer. The dielectric layer is arranged between the second touch electrode and the first transistor of the first pixel structure. The second touch electrode is electrically connected to the control line.

In an embodiment of the present disclosure, the touch display apparatus further comprises a fourth connecting pattern electrically connected to the control line, wherein the fourth connecting pattern is electrically connected to the second touch electrode through a contact of the dielectric layer.

In an embodiment of the present disclosure, the touch display apparatus further comprises an insulating layer arranged on the dielectric layer and the second transistor, wherein the fourth connecting pattern is arranged on the insulating layer and is electrically connected to the second touch electrode through a contact of the insulating layer.

In an embodiment of the present disclosure, the material of the fourth connecting pattern is the same as the material of the pixel electrode of the first pixel structure.

In an embodiment of the present disclosure, a plurality of data lines of the plurality of pixel structures and the read-out line are arranged in a first direction, a plurality of first scan lines of the plurality of pixel structures, the second scan line and the control line are arranged in a second direction, and the first direction and the second direction are staggered.

In order to make the aforementioned and other objectives and advantages of the present disclosure comprehensible, embodiments accompanied with figures are described in detail below.

of the $1^{st}$ first scan line SL1 to the $$\left(\frac{n}{2}\right)^{th}$$

first scan line SL1, the first scan signals $$VSL1\text{-}\left(\frac{n}{2}+1\right)$$

to VSL1-$n$ of the $$\left(\frac{n}{2}+1\right)^{th}$$

first scan line SL1 to the $n^{th}$ first scan line SL1, the second scan signal VSL2-1 of the $1^{st}$ second scan line SL2, the second scan signal VSL2-2 of the $2^{nd}$ second scan line SL2 to the second scan signal VSL2-$m$ of the $m^{th}$ second scan line SL2, and the touch signals VRL on the read-out lines RL of touch structures TS according to another embodiment of the present disclosure.

Figure 7:
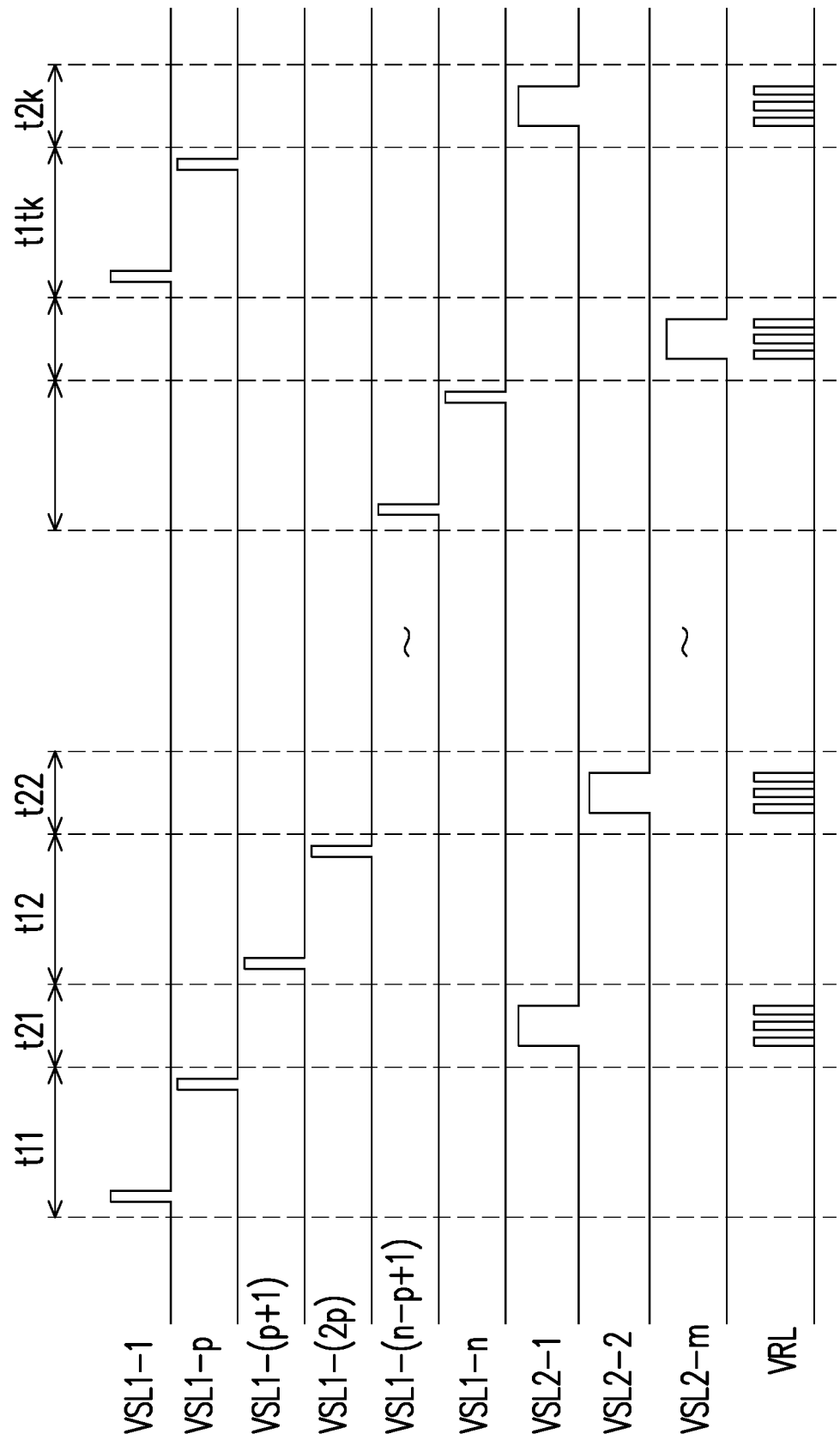

FIG. 7 shows the first scan signals VSL1-1 to VSL1-$p$ of the $1^{st}$ first scan line SL1 to the $p^{th}$ first scan line SL1, the first scan signals VSL1-(p+1) to VSL1-2p of the (p+1)$^{th}$ first scan line SL1 to the 2p$^{th}$ first scan line SL1, the first scan signals VSL1-(n–p+1) to VSL1-n of the (n–p+1)$^{th}$ first scan line SL1 to the n$^{th}$ first scan line SL1, the second scan signals VSL2-1, VSL2-2 to VSL2-m of the 1$^{st}$ second scan line SL2, the 2$^{nd}$ second scan line SL2 to the m$^{th}$ second scan line SL2, and the touch signals VRL on the read-out lines RL of touch structures TS according to another embodiment of the present disclosure.

Figure 8:
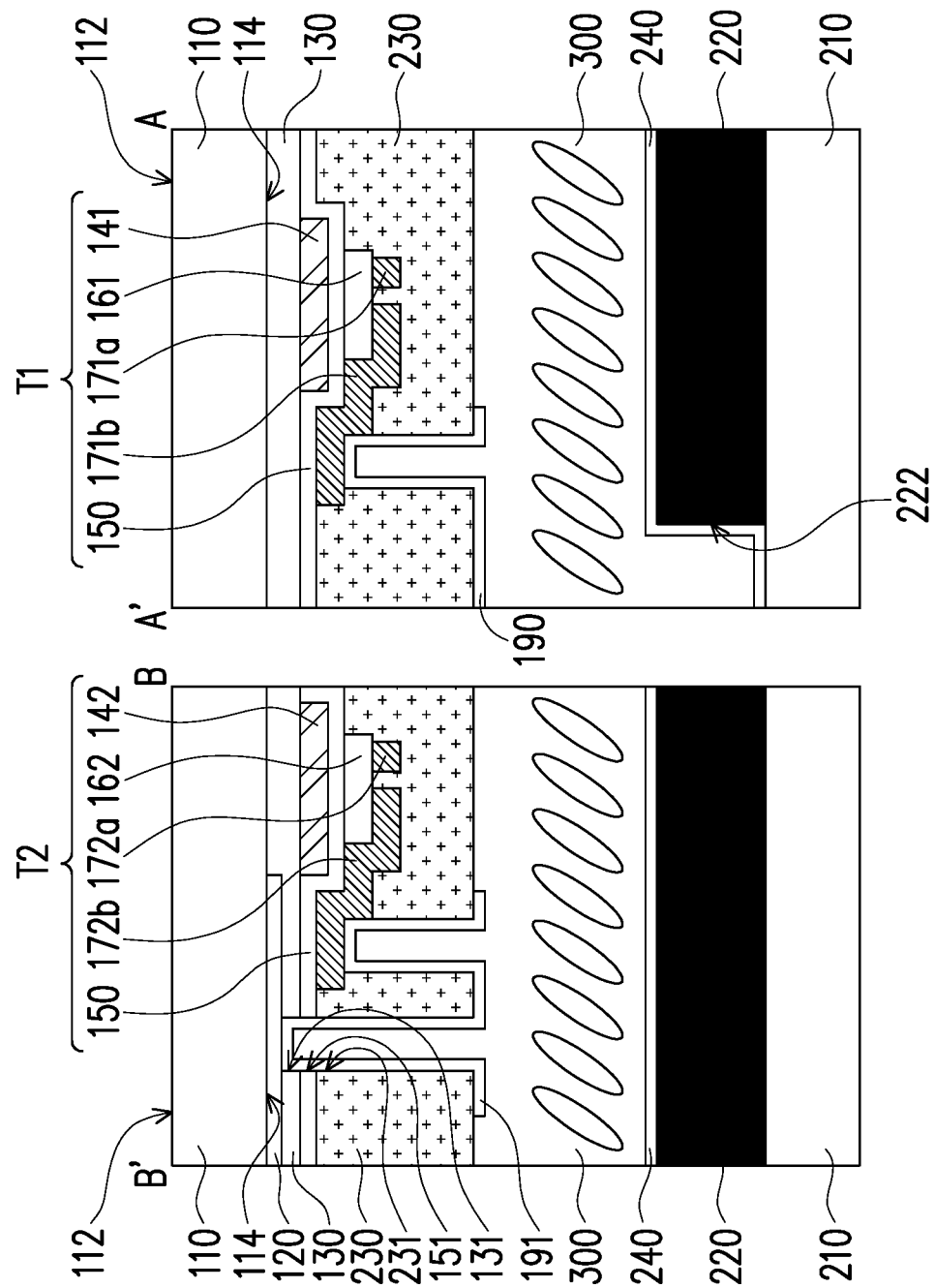

FIG. 8 is a cross-sectional schematic view of a touch display apparatus 10A according to a second embodiment of the present disclosure.

Figure 9:
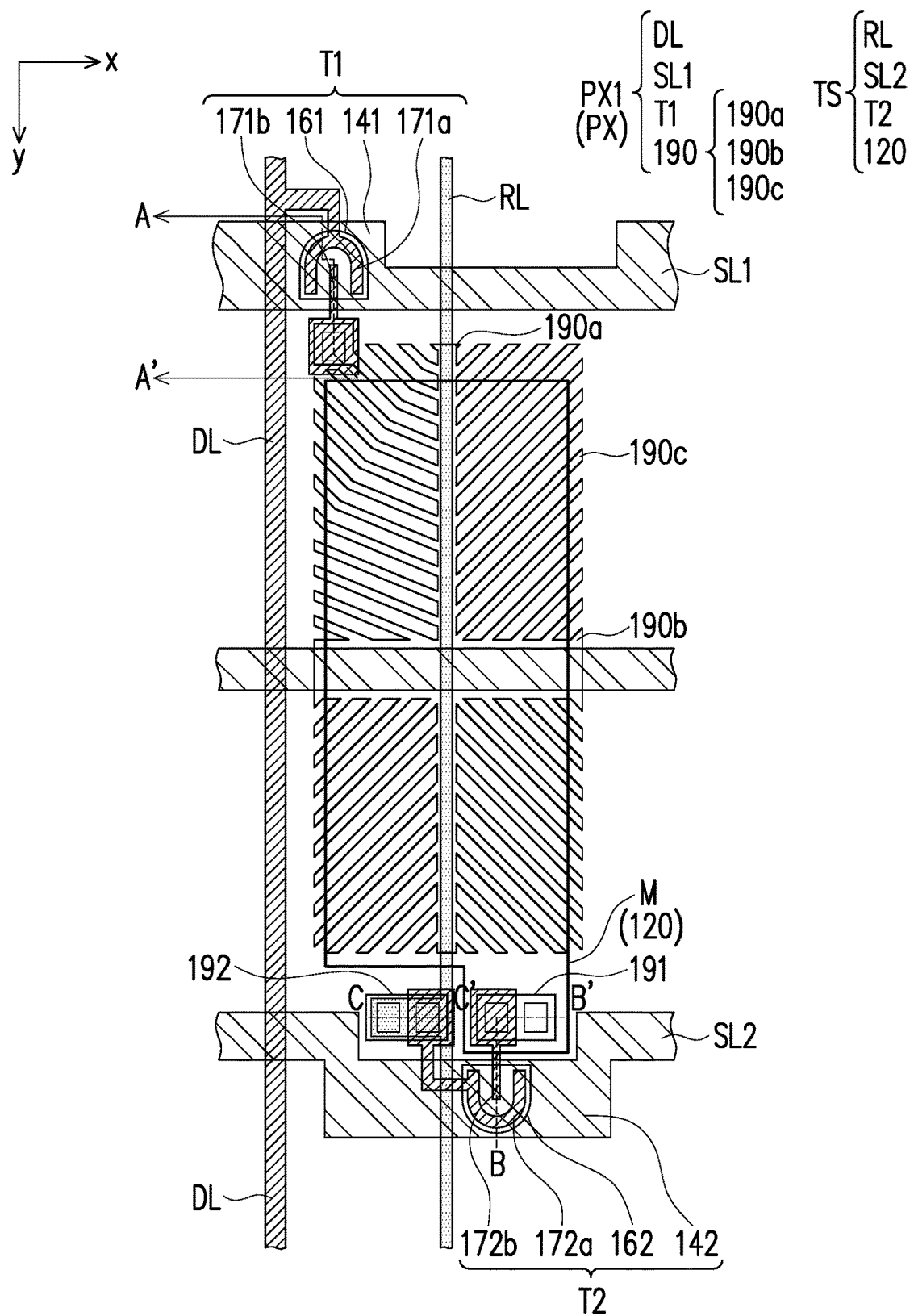

FIG. 9 is a layout schematic view of a touch display apparatus 10B according to a third embodiment of the present disclosure.

Figure 10:
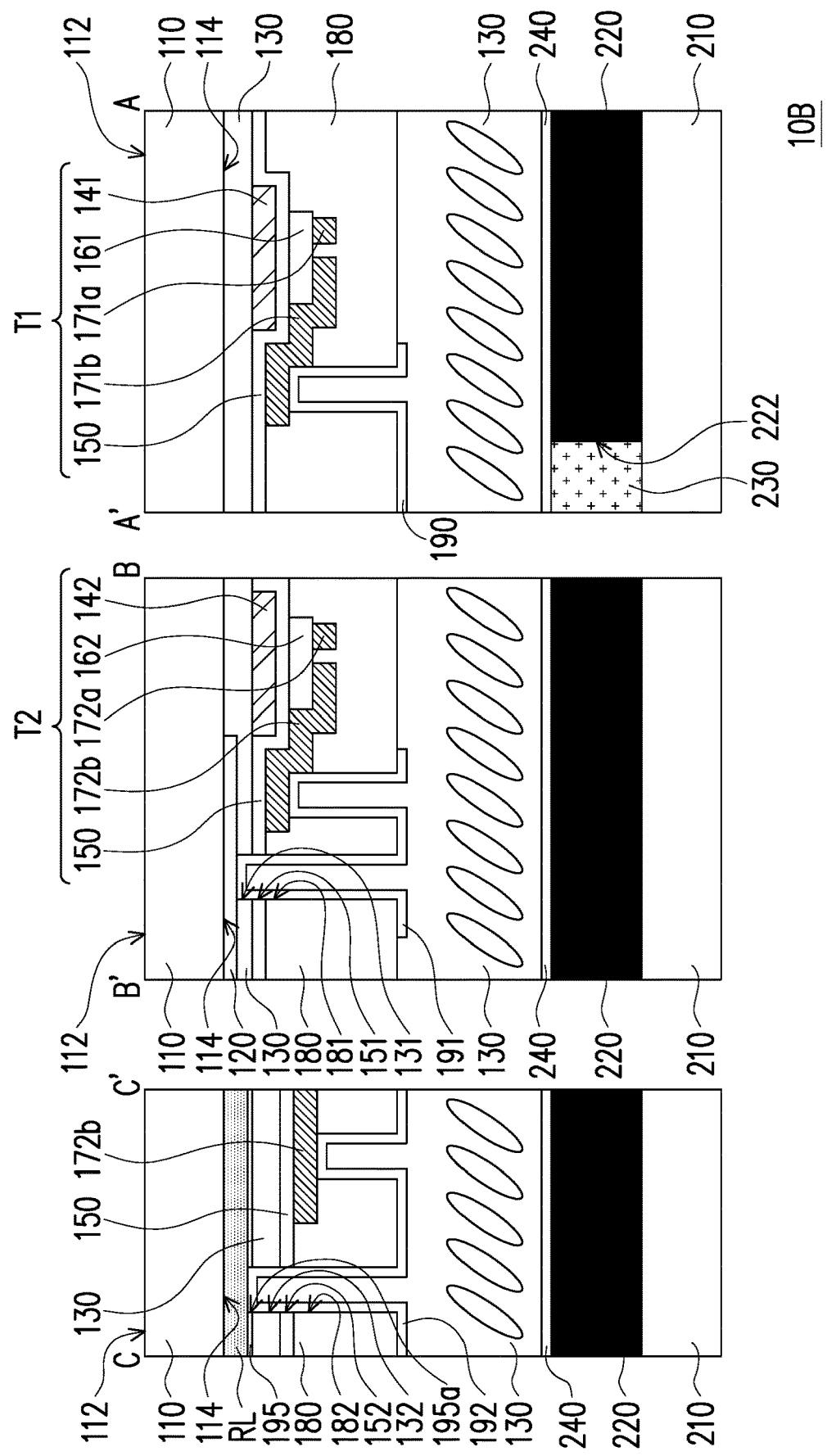

FIG. 10 is a cross-sectional schematic view of the touch display apparatus 10B according to the third embodiment of the present disclosure.

Figure 11:
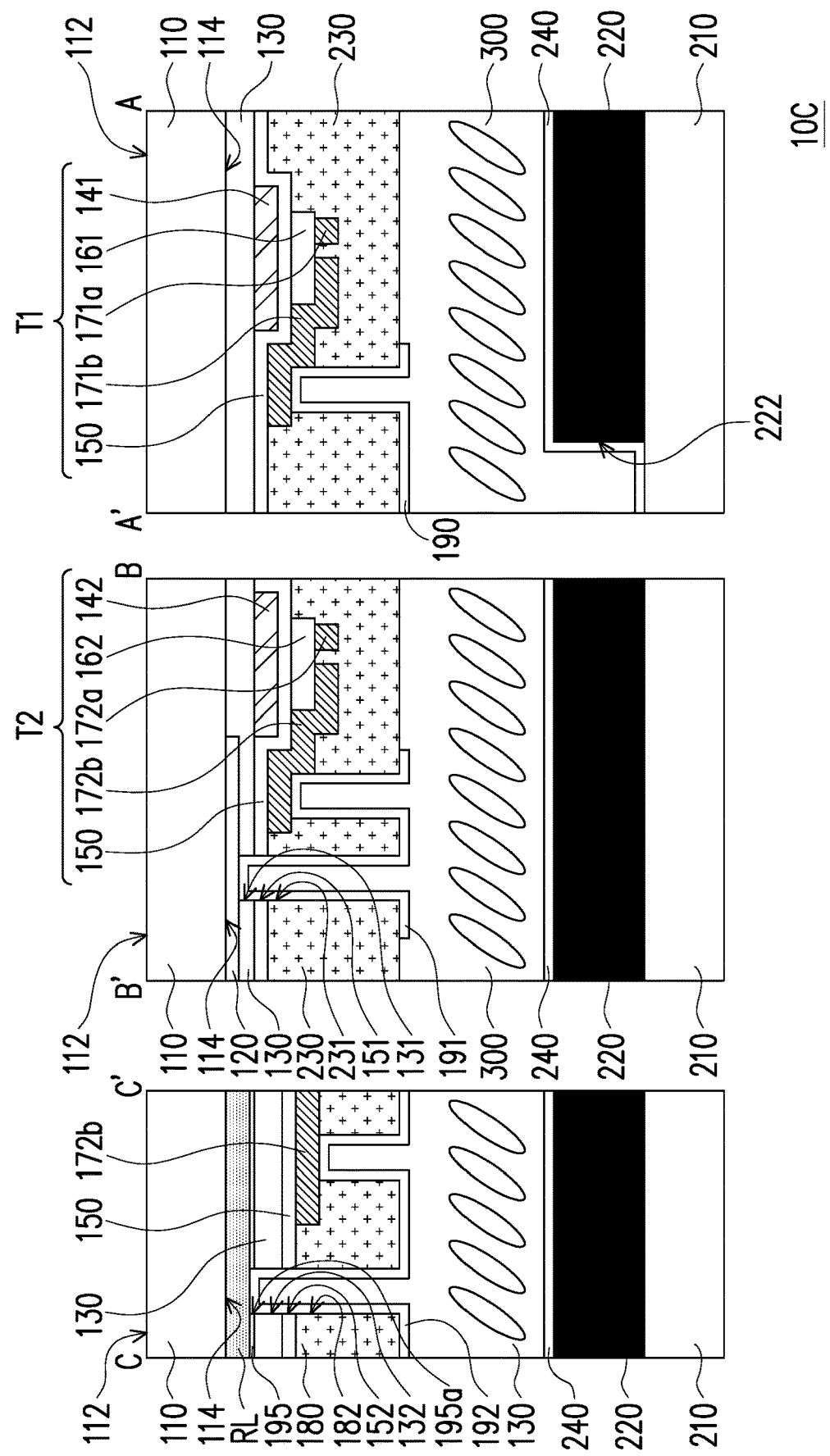

FIG. 11 is a cross-sectional schematic view of a touch display apparatus 10C according to a fourth embodiment of the present disclosure.

Figure 12:
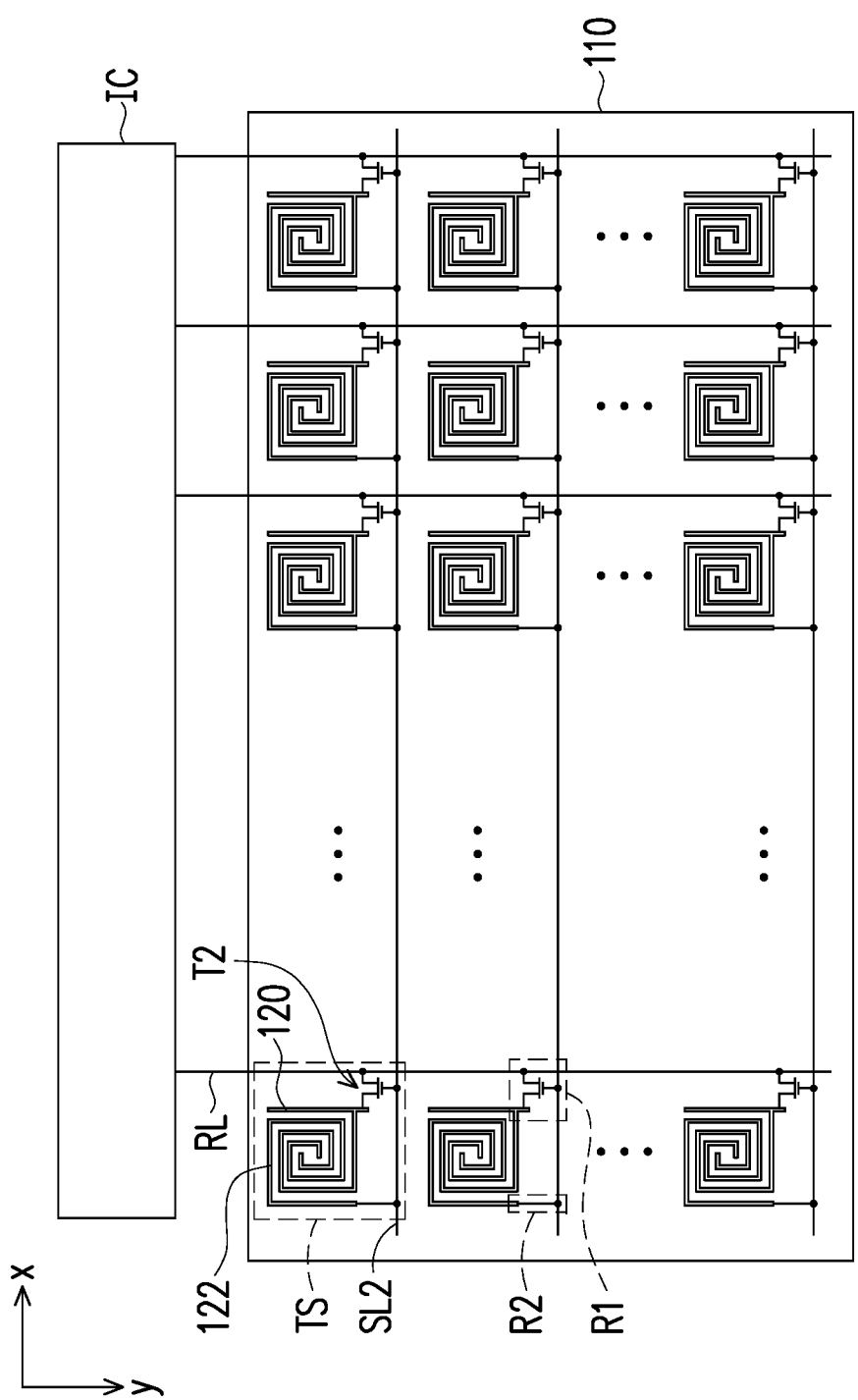

FIG. 12 is a schematic view of a touch display apparatus 20 according to a fifth embodiment of the present disclosure.

Figure 13:
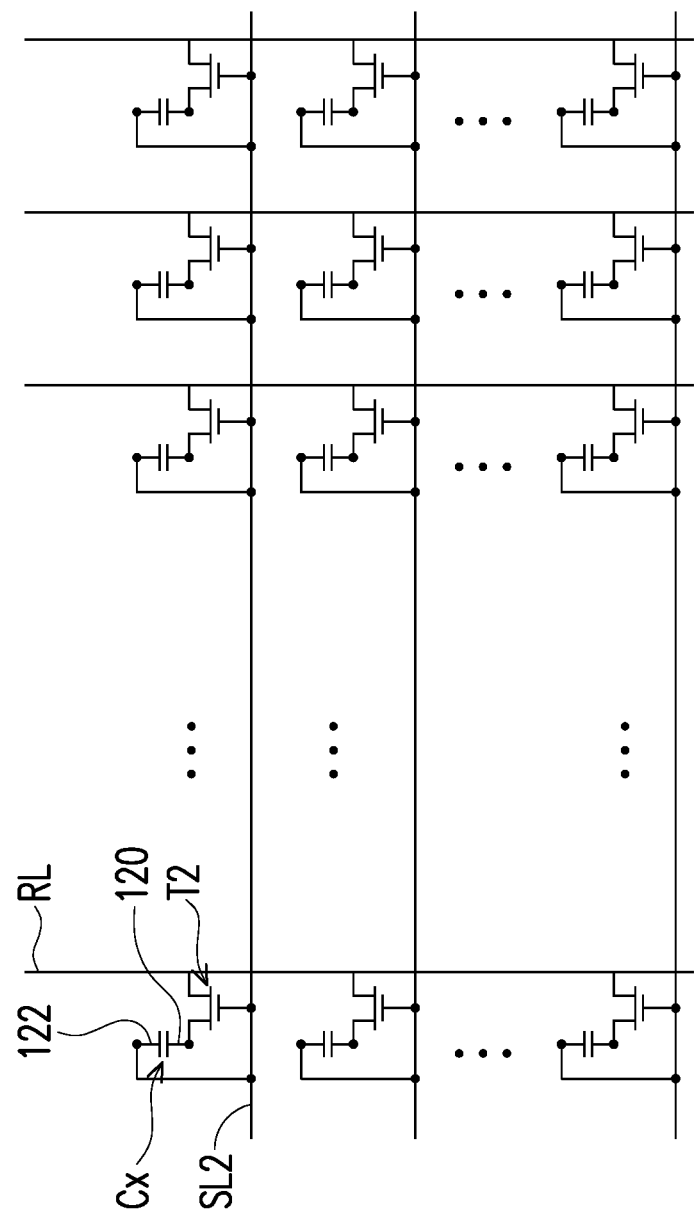

FIG. 13 is an equivalent circuit schematic view of a plurality of touch structures TS of the touch display apparatus 20 according to the fifth embodiment of the present disclosure.

Figures 14A, 14B:
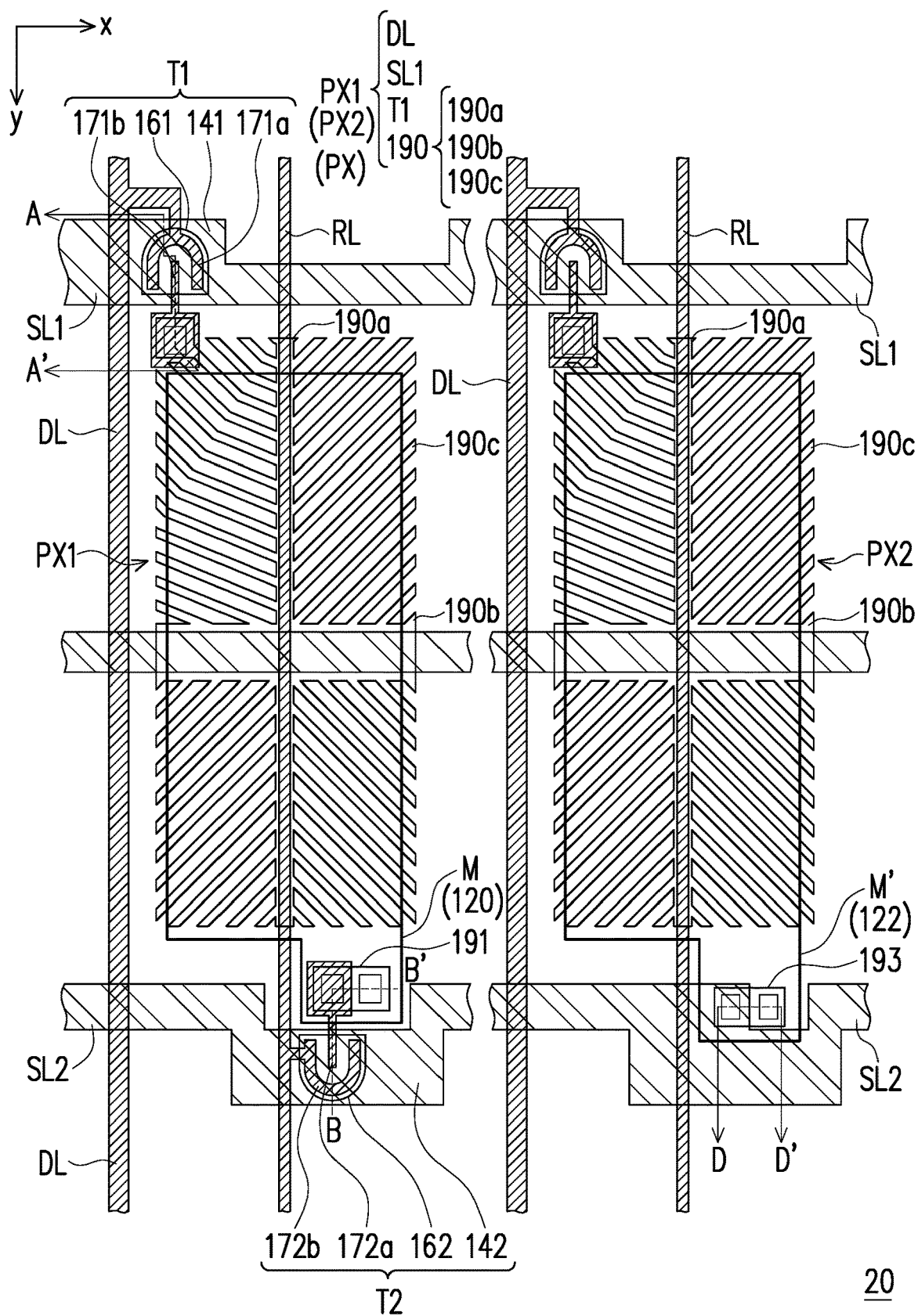

FIG. 14A and FIG. 14B are layout schematic views of the touch display apparatus 20 according to the fifth embodiment of the present disclosure.

Figure 15:
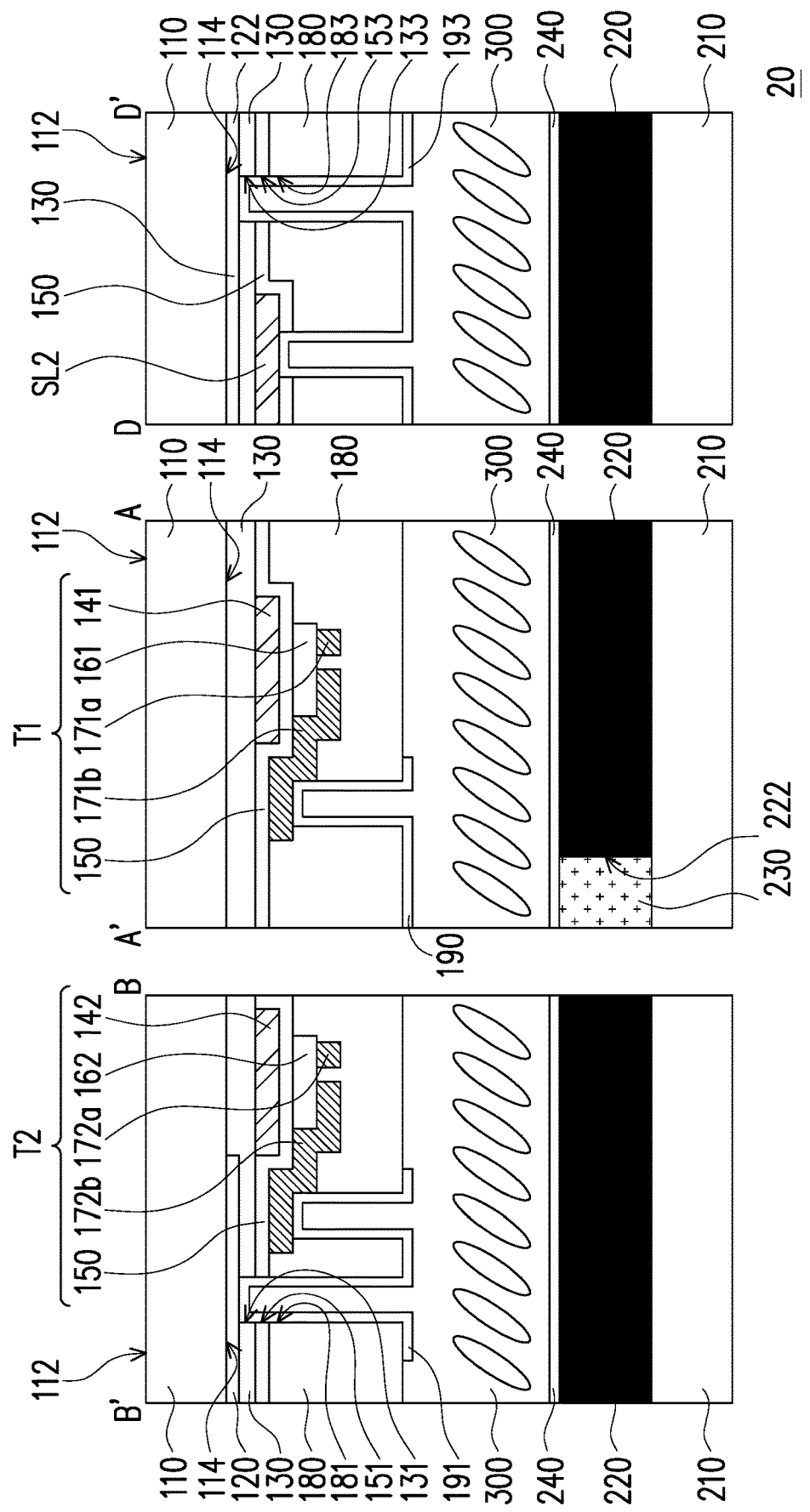

FIG. 15 is a cross-sectional schematic view of the touch display apparatus 20 according to the fifth embodiment of the present disclosure.

Figure 16:
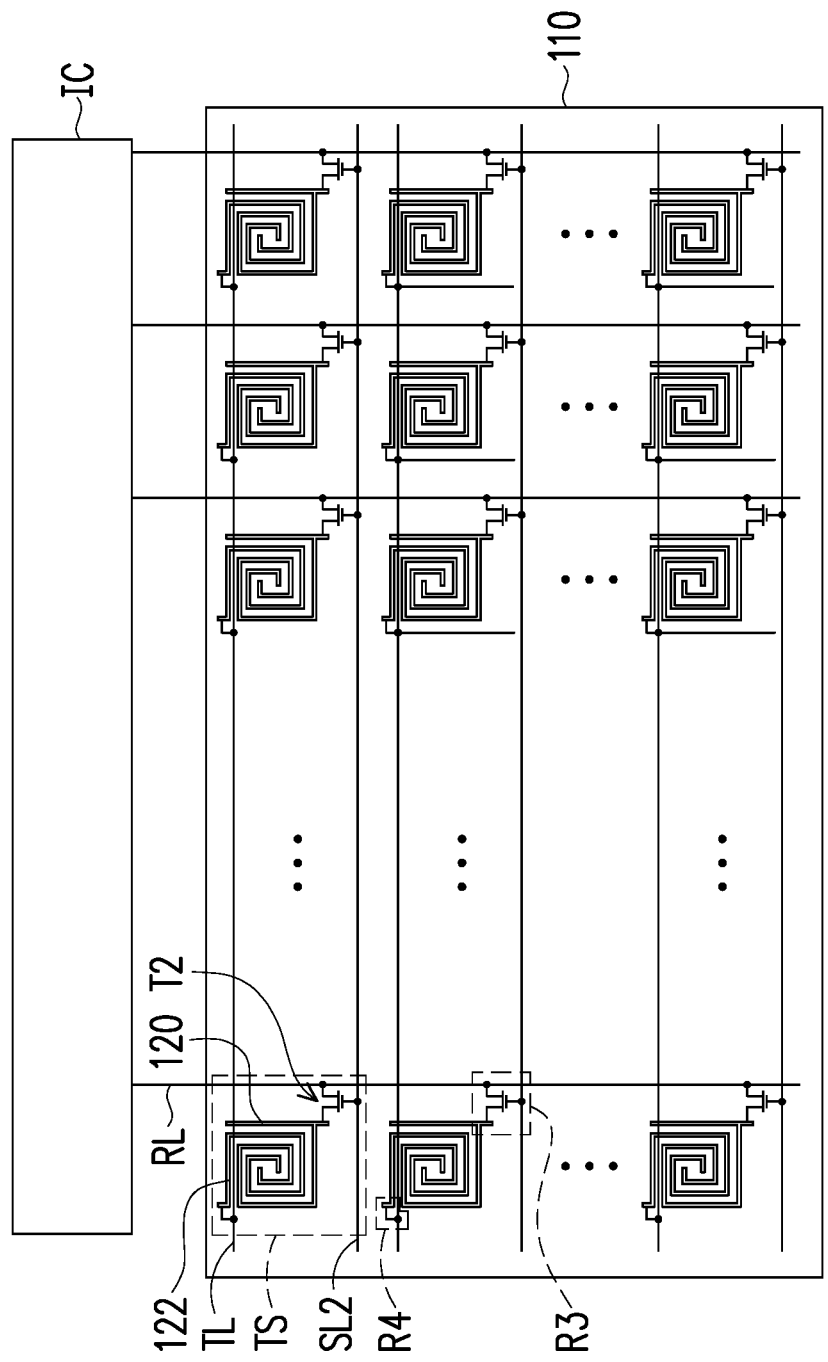

FIG. 16 is a schematic view of a touch display apparatus 20A according to a sixth embodiment of the present disclosure.

Figure 17:
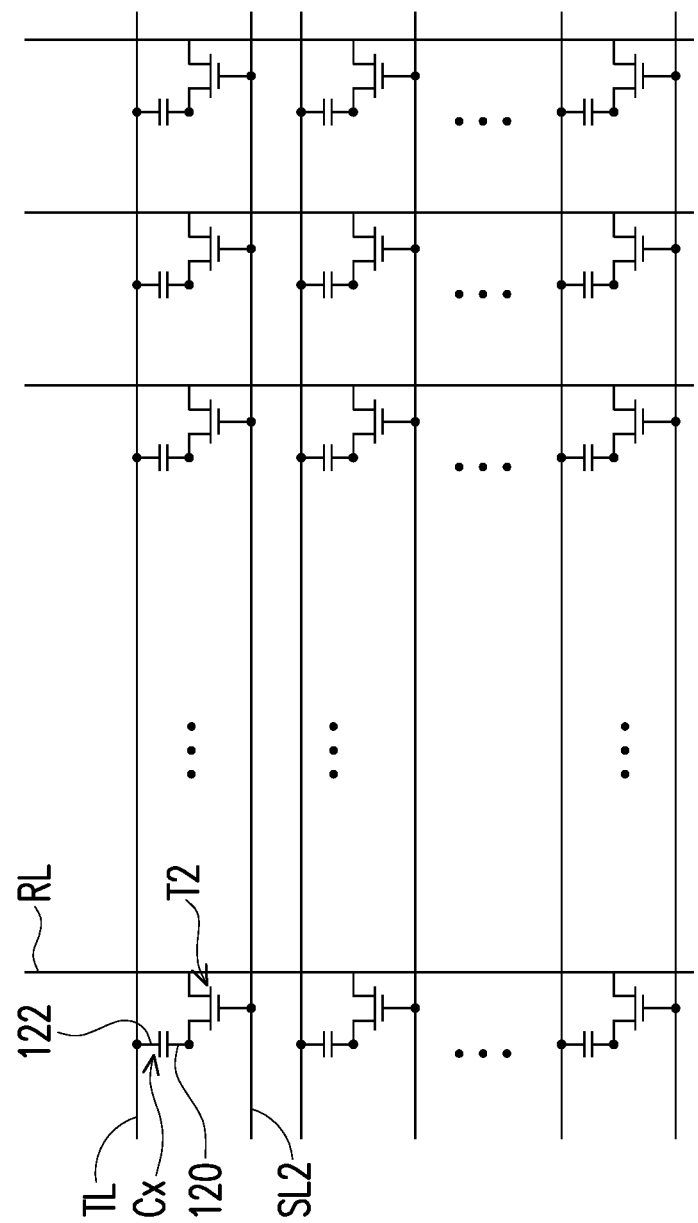

FIG. 17 is an equivalent circuit schematic view of a plurality of touch structures TS of the touch display apparatus 20A according to the sixth embodiment of the present disclosure.

Figures 18A, 18B:
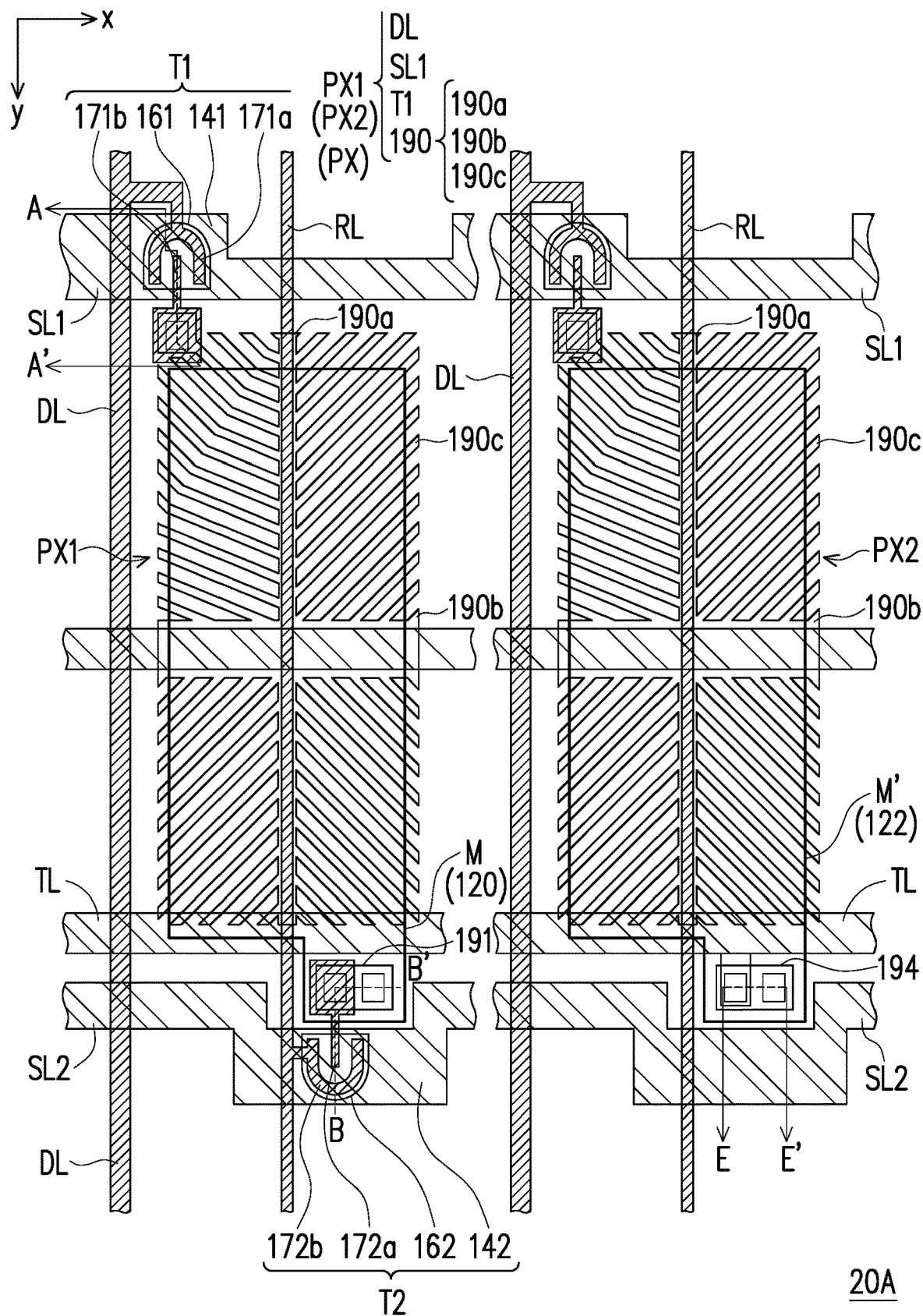

FIG. 18A and FIG. 18B are layout schematic views of the touch display apparatus 20A according to the sixth embodiment of the present disclosure.

Figure 19:
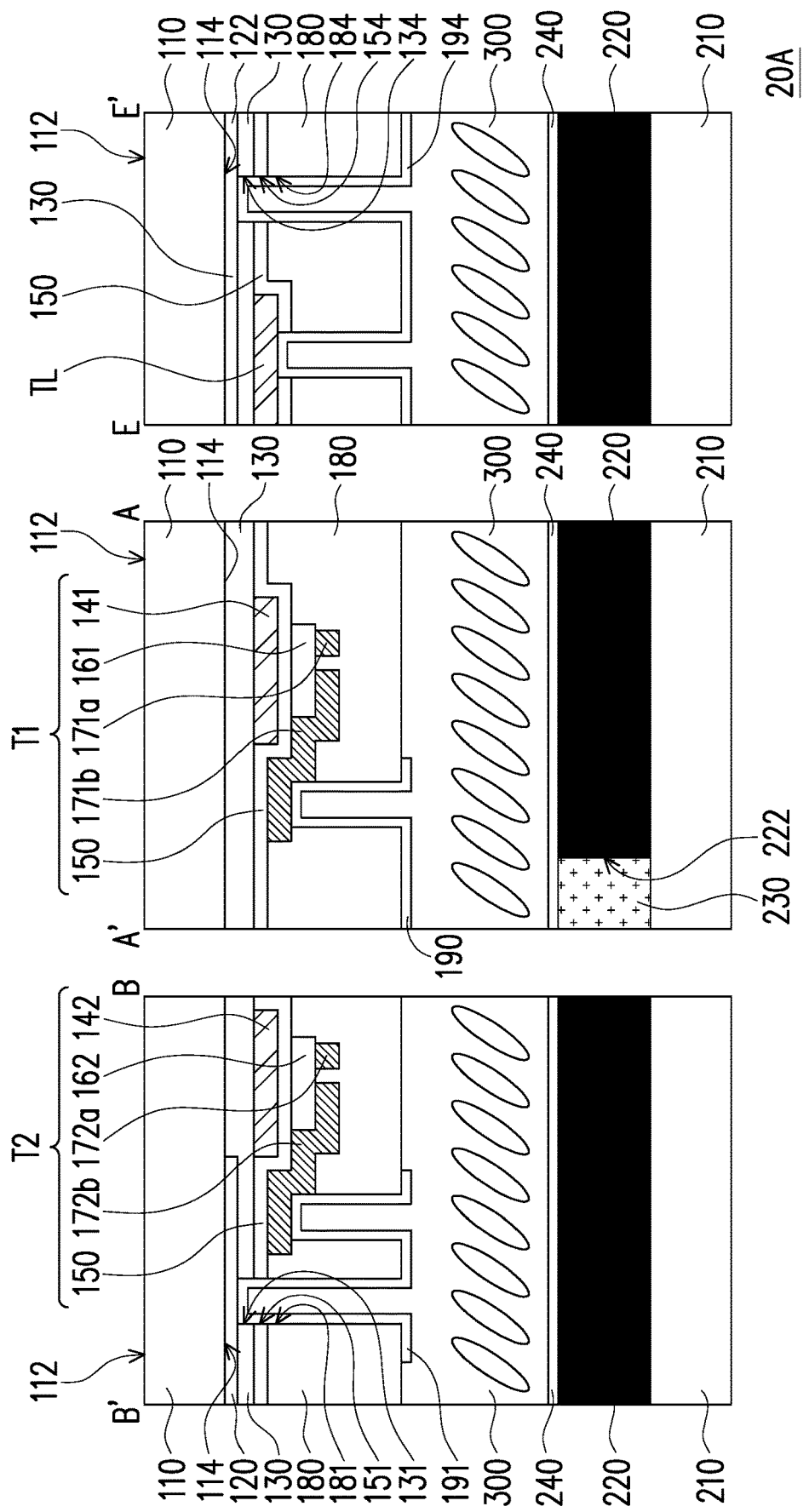

FIG. 19 is a cross-sectional schematic view of the touch display apparatus 20A according to the sixth embodiment of the present disclosure.

Figure 20:
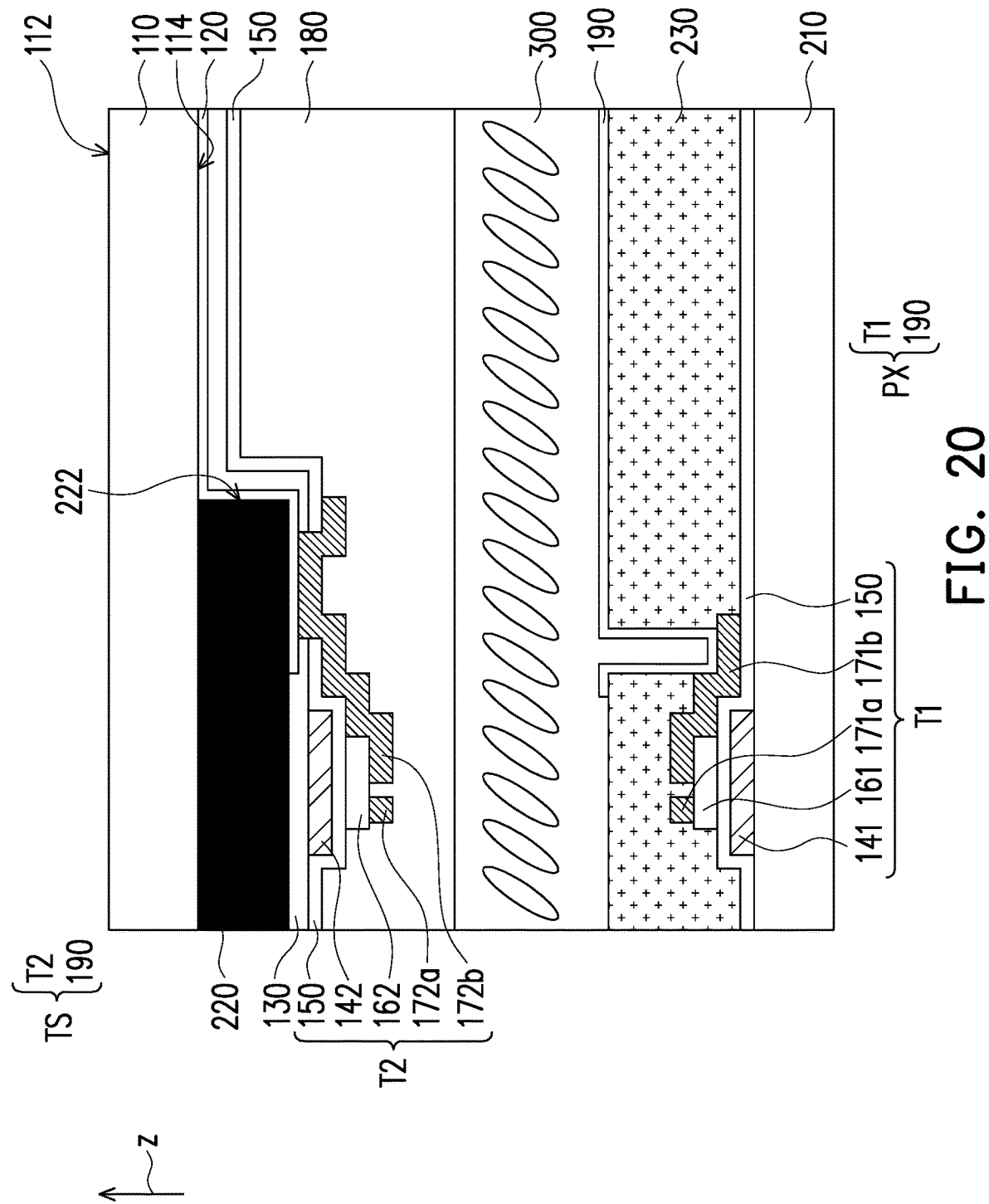

FIG. 20 is a cross-sectional schematic view of a touch display apparatus 30 according to a seventh embodiment of the present disclosure.

Figure 21:
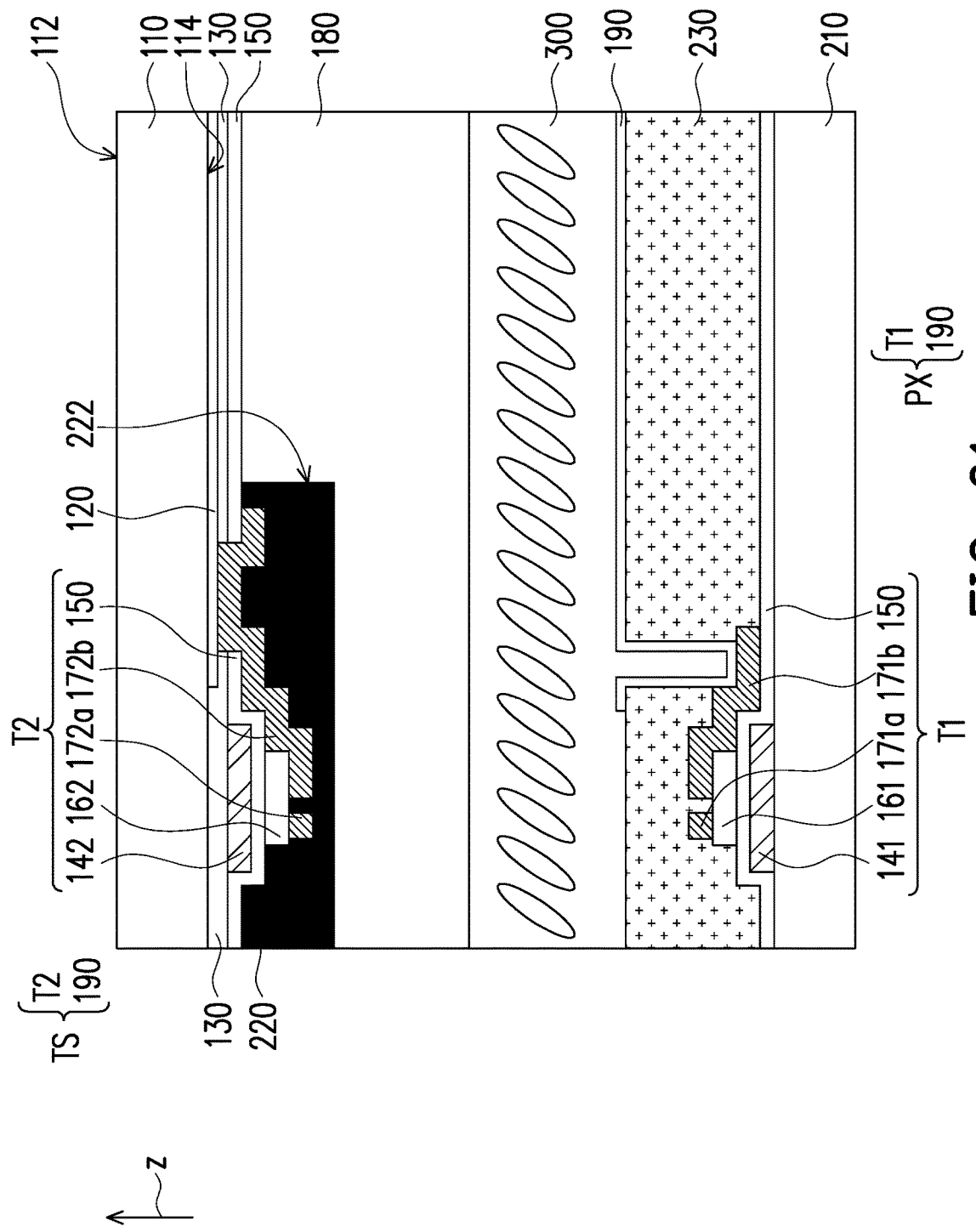

FIG. 21 is a cross-sectional schematic view of a touch display apparatus 30A according to an eighth embodiment of the present disclosure.

DESCRIPTION OF THE EMBODIMENTS

Reference will now be made in detail to the present preferred embodiments of the disclosure, examples of which are illustrated in the accompanying drawings.

Wherever possible, the same reference numbers are used in the drawings and the description to refer to the same or like parts.

In the accompanying drawings, the thicknesses of layers, films, panels, regions, and the like are enlarged for clarity. Throughout the specification, same reference numerals indicate same components. It should be understood that when a component such as a layer, film, region or substrate is referred to as being "on" or "connected" to another component, it may be directly on or connected to the another component, or intervening components may also be present. In contrast, when a component is referred to as being "directly on" or "directly connected to" another component, there are no intervening assemblies present. As used herein, "connection" may refer to a physical and/or electrical connection.

As used herein, "about", "approximately", or "substantially" is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, ±20%, ±10%, ±5% of the stated value. Further, as used herein, "about", "approximately", or "substantially" may depend on optical properties, etch properties, or other properties to select a more acceptable range of deviations or standard deviations without one standard deviation for all properties.

Unless otherwise defined, all terms (including technical and scientific terms) used herein have the same meaning as commonly understood by one of ordinary skill in the art to which the present disclosure belongs. It will be further understood that terms such as those defined in commonly used dictionaries should be interpreted as having a meaning that is consistent with their meaning in the context of the relevant art and the present disclosure and will not be interpreted in an idealized or overly formal sense unless expressly so defined herein.

Figure 1:
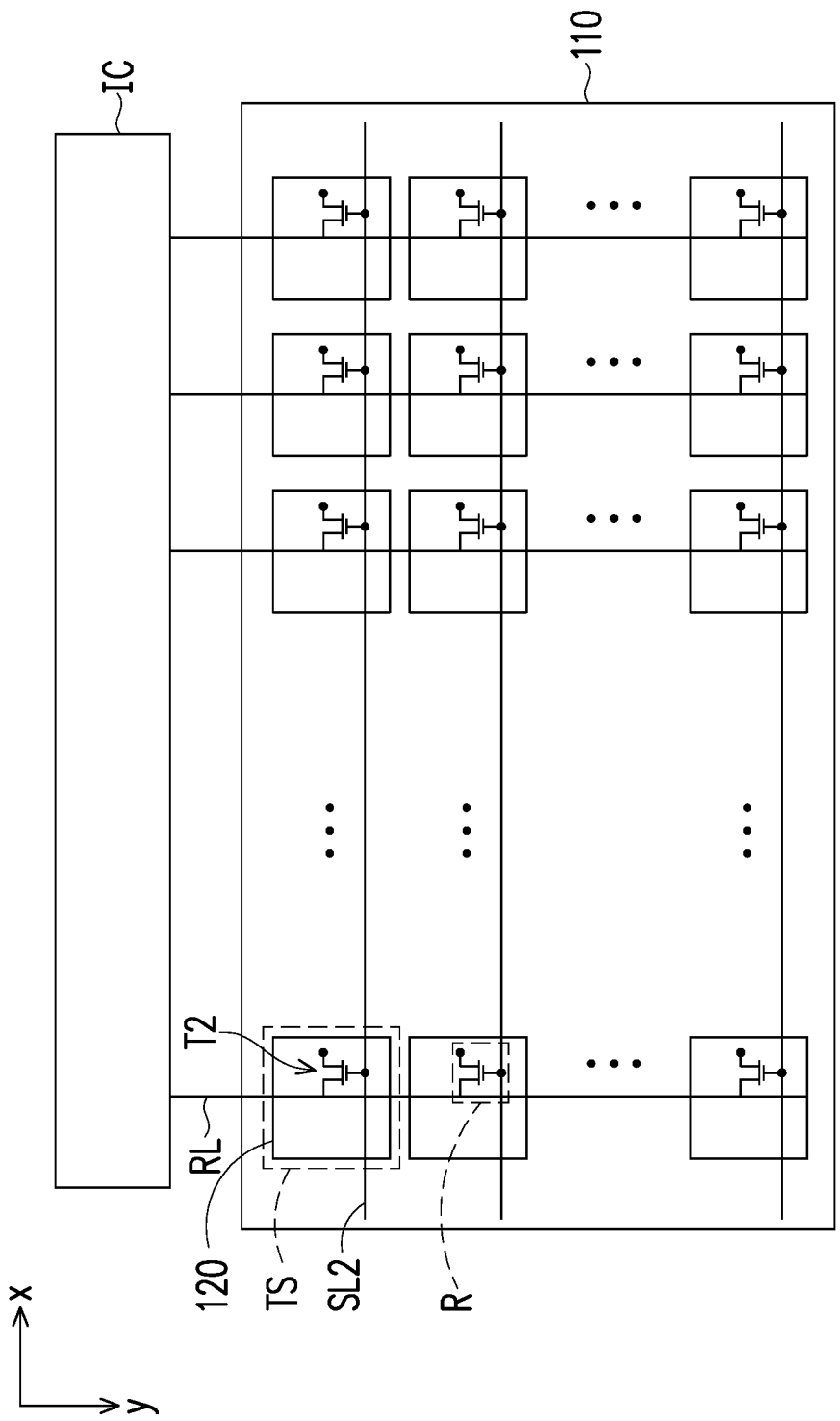
FIG. 1 is a schematic view of a touch display apparatus 10 according to a first embodiment of the present disclosure.

FIG. 1 is a schematic view of a touch display apparatus 10 according to a first embodiment of the present disclosure. FIG. 1 shows a first substrate 110, a plurality of touch structures TS and a chip IC, and omits other components of the touch display apparatus 10.

Figure 2:
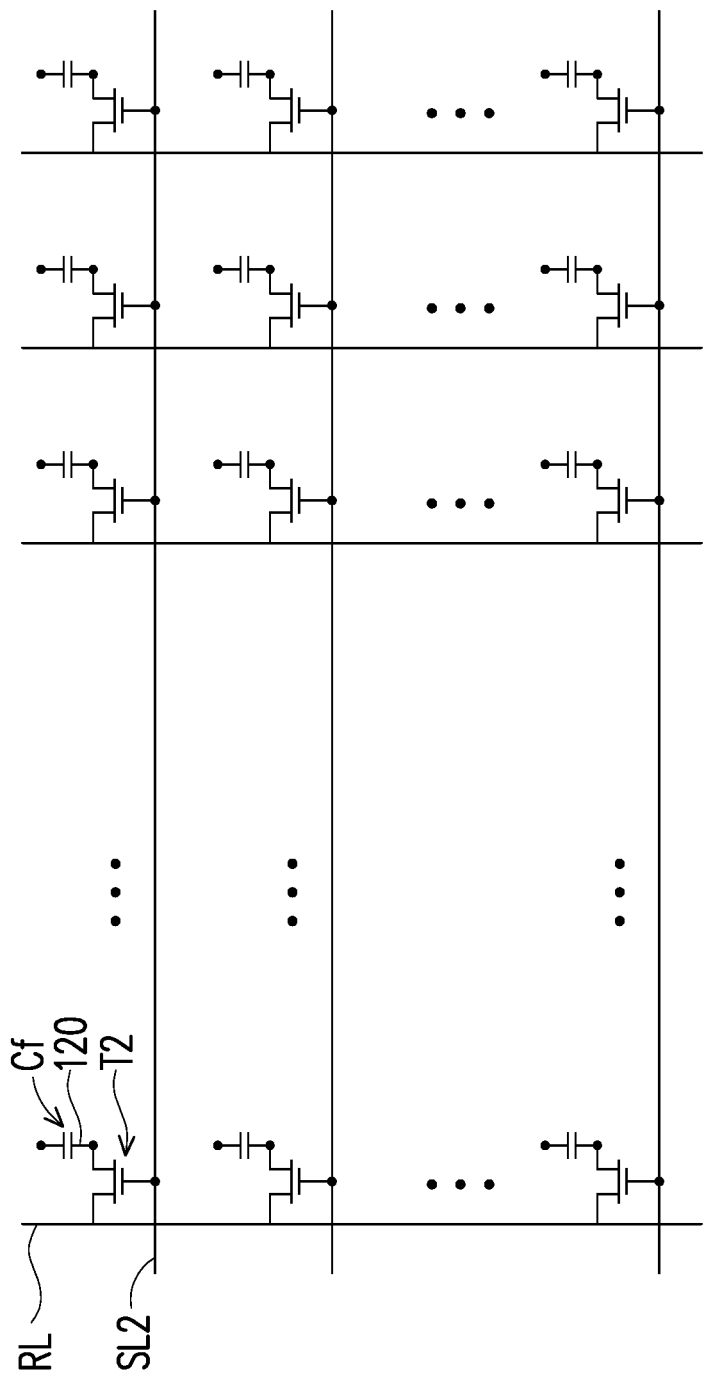
FIG. 2 is an equivalent circuit schematic view of a plurality of touch structures TS of the touch display apparatus 10 according to the first embodiment of the present disclosure.

FIG. 2 is an equivalent circuit schematic view of a plurality of touch structures TS of the touch display apparatus 10 according to the first embodiment of the present disclosure.

Figure 3:
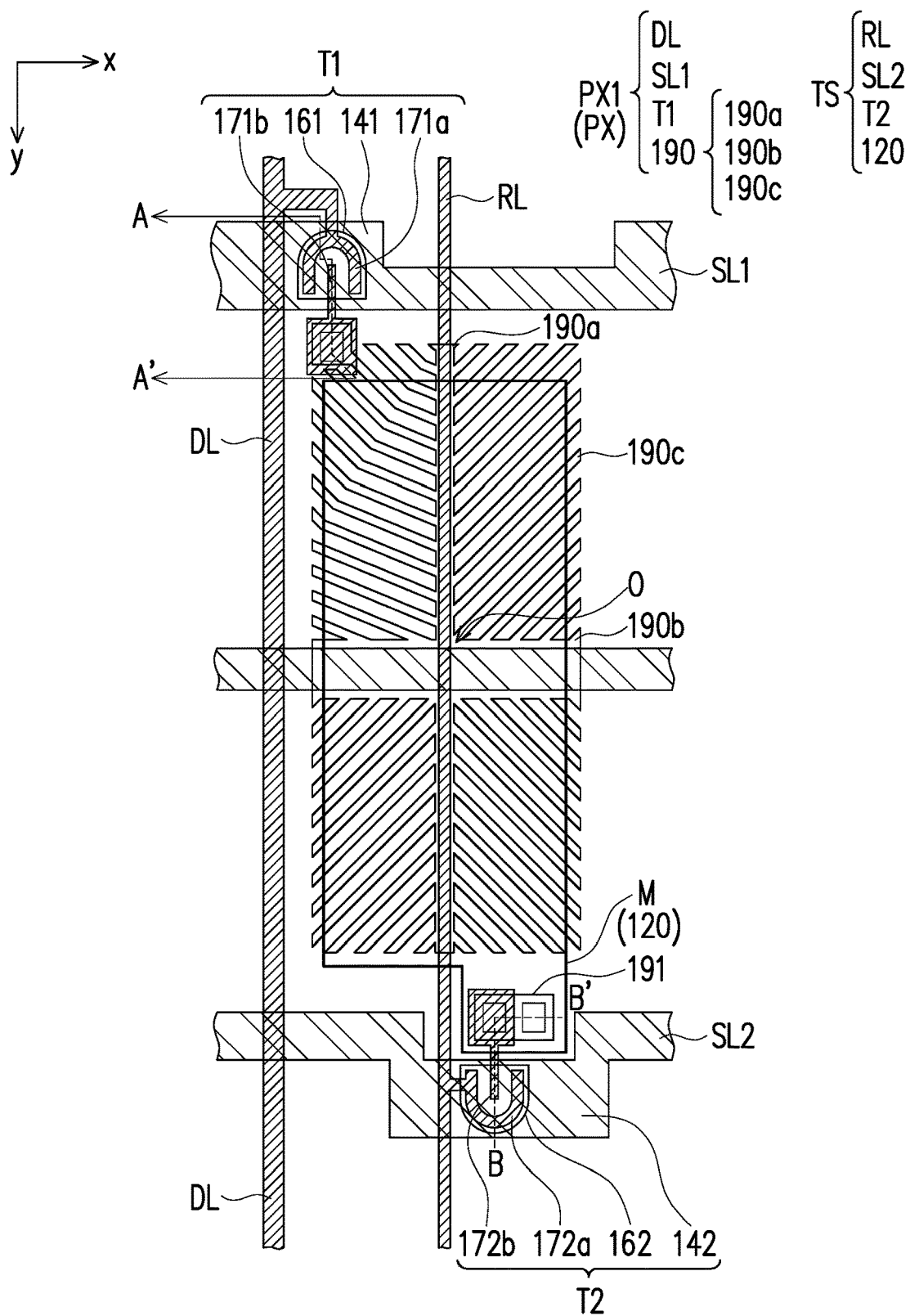
FIG. 3 is a layout schematic view of the touch display apparatus 10 according to the first embodiment of the present disclosure.

FIG. 3 is a layout schematic view of the touch display apparatus 10 according to the first embodiment of the present disclosure. FIG. 3 is corresponding to the portion R of FIG. 1. It should be noted that FIG. 3 shows a main portion M of a first touch electrode 120 overlapped with a pixel electrode 190 and omits other portions of the first touch electrode 120 in FIG. 1.

Figure 4:
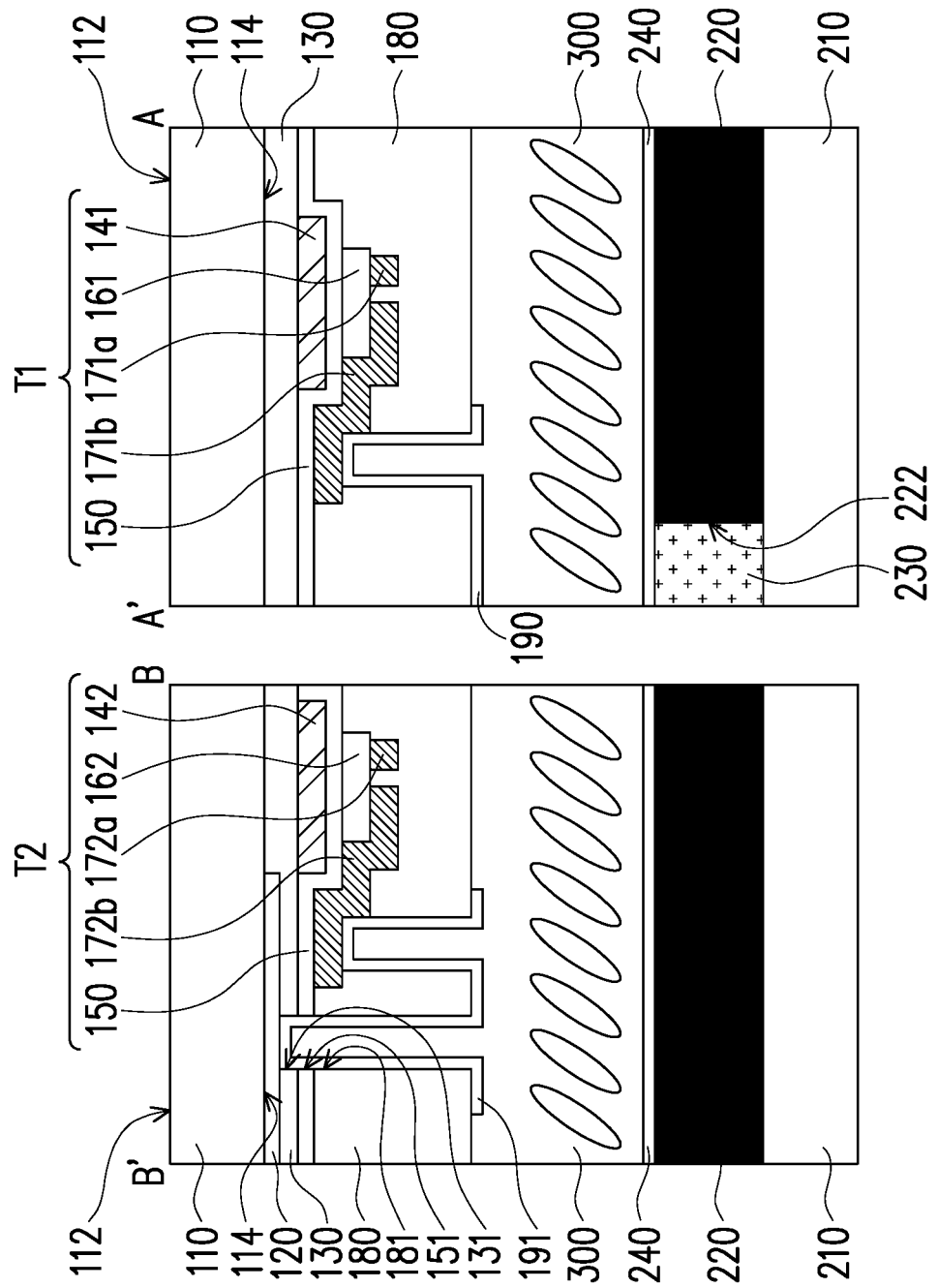
FIG. 4 is a cross-sectional schematic view of the touch display apparatus 10 according to the first embodiment of the present disclosure.

FIG. 4 is a cross-sectional schematic view of the touch display apparatus 10 according to the first embodiment of the present disclosure. FIG. 4 is corresponding to a section line A-A' and a section line B-B' in FIG. 3.

Referring to FIG. 1 to FIG. 3, the touch display apparatus 10 comprises a plurality of touch structures TS. Each of the touch structures TS comprises a second transistor T2, a read-out line RL, a second scan line SL2 and a first touch electrode 120.

Referring to FIG. 3 and FIG. 4, the second transistor T2 comprises a control end 142, a gate insulating layer 150, a semiconductor pattern 162, a first end 172a and a second end 172b. The gate insulating layer 150 is arranged between the control end 142 and the semiconductor pattern 162. The first end 172a and the second end 172b are electrically connected to two different regions of the semiconductor pattern 162 respectively.

Referring to FIG. 1, FIG. 3 and FIG. 4, the read-out line RL is electrically connected to the first end 172a of the second transistor T2. The second scan line SL2 is electrically connected to the control end 142 of the second transistor T2. The first touch electrode 120 is electrically connected to the second end 172b of the second transistor T2.

Referring to FIG. 1 and FIG. 2, in the present embodiment, the touch structure TS of the touch display apparatus 10 is a self-capacitance touch structure. The first touch electrode 120 of the touch structure TS and a touch component (not shown) form capacitance Cf. When the touch component approaches the first touch electrode 120, a change of the capacitance Cf is generated. The change of the capacitance Cf can be transmitted to the chip IC through the second transistor T2 and the read-out line RL, thereby determining the touch position of the touch component. For example, in the present embodiment, the touch component can be a finger, a touch pen or other articles.

Referring to FIG. 3, the touch display apparatus 10 comprises a plurality of pixel structures PX. FIG. 3 shows one pixel structure PX as an example. People having ordinary knowledge in this field should understand that the display portion of the touch display apparatus 10 comprises a plurality of pixel structures PX arranged in an array.

Referring to FIG. 3 and FIG. 4, each pixel structure PX comprises a data line DL, a first scan line SL1, a first transistor T1 and a pixel electrode 190. The first transistor T1 is provided with a control end 141, a gate insulating layer 150, a semiconductor pattern 161, a first end 171a and a second end 171b. The gate insulating layer 150 is arranged between the control end 141 and the semiconductor pattern 161. The first end 171a and the second end 171b are electrically connected to two different regions of the semiconductor pattern 161 respectively. The data line DL is electrically connected to the first end 171a of the first transistor T1. The first scan line SL1 is electrically connected to the control end 141 of the first transistor T1. The pixel electrode 190 is electrically connected to the second end 171b of the first transistor T1. The plurality of pixel structures PX comprise a first pixel structure PX1. The first touch electrode 120 is at least overlapped with the pixel electrode 190 of the first pixel structure PX1.

Referring to FIG. 4, the touch display apparatus 10 comprises a first substrate 110, a second substrate 210 and a display medium 300. The first substrate 110 is provided with an outer surface 112 and an inner surface 114 which are opposite to each other. The second substrate 210 is arranged opposite to the first substrate 110. The display medium 300 is arranged between the inner surface 114 of the first substrate 110 and the second substrate 210. The outer surface 112 of the first substrate 110 is a touch surface. In other words, the outer surface 112 of the first substrate 110 is suitable for being touched by the touch component (not shown).

In the present embodiment, the display medium 300 can be a non-self-luminescent material, including but not limited to liquid crystal. However, the present disclosure is not limited thereto. According to other embodiments, the display medium 300 can also be a self-luminescent material, including but not limited to an organic electroluminescent material and a micro light emitting diode (μLED).

In the present embodiment, the material of the first substrate 110 can be glass, quartz, an organic polymer or other applicable materials, and the material of the second substrate 210 can be glass, quartz, an organic polymer, an opaque/reflective material (such as a conductive material, a wafer, ceramic or other applicable materials), or other applicable materials.

A plurality of touch structures TS are arranged on the inner surface 114 of the first substrate 110. Specifically, in the present embodiment, the first touch electrode 120 is arranged on the inner surface 114 of the first substrate 110. The touch display apparatus 10 also comprises a dielectric layer 130 arranged on the first touch electrode 120. The first touch electrode 120 is arranged between the first substrate 110 and the dielectric layer 130. The first transistor T1 of the pixel structure PX is arranged on the dielectric layer 130. The dielectric layer 130 is arranged between the first touch electrode 120 and the first transistor T1 of the pixel structure PX.

In the present embodiment, the first touch electrode 120 can be a transparent conductive layer including a metal oxide such as an indium tin oxide, an indium zinc oxide, an aluminum tin oxide, an aluminum zinc oxide, an indium germanium zinc oxide, other appropriate oxides, or a stack layer of the at least two oxides.

In the present embodiment, the touch display apparatus 10 further comprises an insulating layer 180 arranged on the first transistor T1 of the pixel structure PX. The insulating layer 180 can also be referred to as a flat layer.

In the present embodiment, the touch display apparatus 10 further comprises a first connecting pattern 191 electrically connected to the second end 172b of the second transistor T2 of the touch structure TS. The first connecting pattern 191 is arranged on the insulating layer 180 and is electrically connected to the first touch electrode 120 through a contact 181 of the insulating layer 180, a contact 151 of the gate insulating layer 150 and a contact 131 of the dielectric layer 130.

The plurality of pixel structures PX are arranged between the first substrate 110 and the display medium 300 or between the second substrate 210 and the display medium 300.

For example, in the present embodiment, the plurality of pixel structures PX can be arranged between the first substrate 110 and the display medium 300. That is, in the present embodiment, the plurality of pixel structures PX and the plurality of touch structures TS are selectively arranged on the inner surface 114 of the first substrate 110, but the present disclosure is not limited thereto.

Specifically, in the present embodiment, the first transistor T1 of the pixel structure PX is arranged on the dielectric layer 130. The insulating layer 180 is arranged on the first transistor T1 of the pixel structure PX. The pixel electrode 190 is arranged on the insulating layer 180 and is electrically connected to the second end 171b of the first transistor T1.

In the present embodiment, the material of the pixel electrode 190 of the pixel structure PX can be the same as the material of the first connecting pattern 191. In other words, the pixel electrode 190 and the first connecting pattern 191 can be formed on the same film layer, and the pixel electrode 190 and the first connecting pattern 191 can be fabricated together. Therefore, the process of fabricating the touch display apparatus 10 can be simplified.

Referring to FIG. 3 and FIG. 4, in the present embodiment, the data line DL of the pixel structure PX and the read-out line RL of the touch structure TS are arranged in a first direction x, and the first scan line SL1 of the pixel structure PX and the second scan line SL2 of the touch structure TS are arranged in a second direction y, wherein the first direction x and the second direction y are staggered. For example, in the present embodiment, the first direction x is substantially perpendicular to the second direction y, but the present disclosure is not limited thereto.

In addition, in the present embodiment, the data line DL of the pixel structure PX is substantially parallel to the read-out line RL of the touch structure TS; the first scan line SL1 of the pixel structure PX is substantially parallel to the second scan line SL2 of the touch structure TS; a vertical projection of the first scan line SL1 of the pixel structure PX on the first substrate 110 and a vertical projection of the second scan line SL2 of the touch structure TS on the first substrate 110 can be respectively positioned at two opposite sides of a vertical projection of the pixel electrode 190 of the pixel structure PX on the first substrate 110; but the present disclosure is not limited thereto.

Referring to FIG. 3 and FIG. 4, in the present embodiment, the pixel structure PX further comprises a shared electrode 240. The potential difference between the shared electrode 240 and the pixel electrode 190 is used for driving the display medium 300.

For example, in the present embodiment, the display portion of the touch display apparatus 10 can be a multi-domain vertical alignment (MVA) type liquid crystal display, the pixel electrode 190 comprises a first main part 190a, a second main part 190b staggered with the first main part 190a and a plurality of branch parts 190c connected to the first main part 190a and the second main part 190b, and the pixel electrode 190 and the shared electrode 240 can be respectively arranged on the first substrate 110 and the second substrate 210. However, the present disclosure is not limited thereto. According to other embodiments, the pixel electrode 190 can also be of other shapes, and/or the pixel electrode 190 and the shared electrode 240 can also be arranged on the same substrate.

It should be noted that in the present embodiment, the read-out line RL of the touch structure TS can be overlapped with the first main part 190a of the pixel electrode 190. Or, the read-out line RL can span the central part O of the pixel electrode 190. The distribution directions of display mediums 300 (such as liquid crystals) on the first main part 190a are inconsistent so as to form a disclination line, and the read-out line RL is overlapped with the first main part 190a of the pixel electrode 190, so that the influence of the read-out line RL on the penetration rate of the touch display apparatus 10 can be reduced.

Referring to FIG. 4, in the present embodiment, the touch display apparatus 10 further comprises a shading pattern 220 provided with an opening 222. The opening 222 of the shading pattern 220 is overlapped with the pixel electrode 190. In the present embodiment, the touch display apparatus 10 further comprises a color filter layer 230 overlapped with the pixel electrode 190. For example, in the present embodiment, the shading pattern 220 and the color filter layer 230 are selectively arranged on the second substrate 210, but the present disclosure is not limited thereto.

Referring to FIG. 1 and FIG. 3, the touch display apparatus 10 has the $1^{st}$ first scan line SL1 to the $n^{th}$ first scan line SL1 of a plurality of pixel structures PX sequentially arranged in a second direction y, and the $1^{st}$ second scan line SL2 to the $m^{th}$ second scan line SL2 of a plurality of touch structures TS sequentially arranged in the second direction y, wherein n and m are positive integers equal to or greater than 2.

Figure 5:
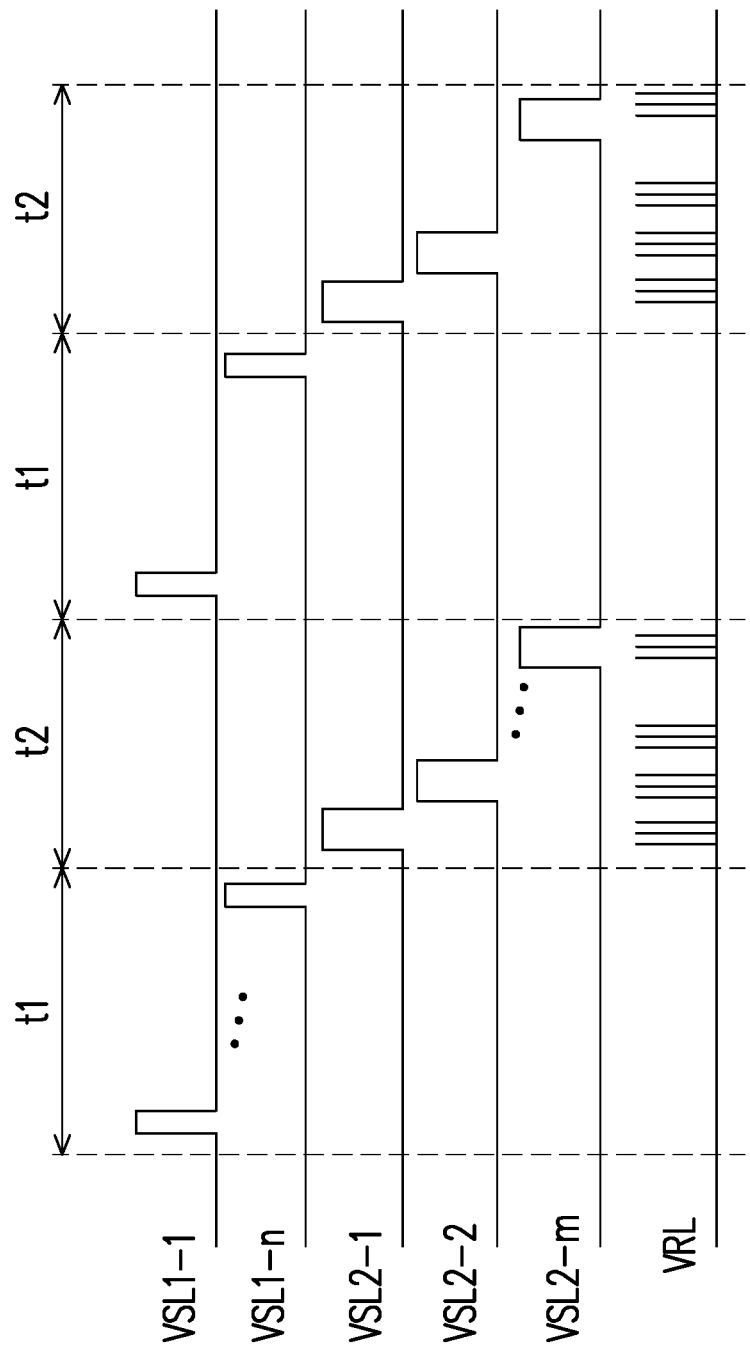
FIG. 5 shows the first scan signals VSL1-1 to VSL1-$n$ of the $1^{st}$ first scan line SL1 to the $n^{th}$ first scan line SL1, the second scan signal VSL2-1 of the $1^{st}$ second scan line SL2, the second scan signal VSL2-2 of the $2^{nd}$ second scan line SL2 to the second scan signal VSL2-$m$ of the $m^{th}$ second scan line SL2, and the touch signals VRL on the read-out lines RL of touch structures TS according to an embodiment of the present disclosure.

FIG. 5 shows the first scan signals VSL1-1 to VSL1-$n$ of the $1^{st}$ first scan line SL1 to the $n^{th}$ first scan line SL1, the second scan signal VSL2-1 of the $1^{st}$ second scan line SL2, the second scan signal VSL2-2 of the $2^{nd}$ second scan line SL2 to the second scan signal VSL2-$m$ of the $m^{th}$ second scan line SL2, and the touch signals VRL on the read-out lines RL of touch structures TS according to an embodiment of the present disclosure.

Referring to FIG. 1, FIG. 3 and FIG. 5, in a display interval t1, the first scan signals VSL1-1 to VSL1-$n$ of the first scan line SL1 to the $n^{th}$ first scan line SL1 have a first gate turn-on potential according to a time sequence, and a plurality of first transistors T1 of a plurality of pixel structures PX in the $1^{st}$ to $n^{th}$ horizontal rows are turned on according to the time sequence so as to display a complete frame picture in the display interval t1. In a touch interval t2 following the display interval t1, the $1^{st}$ second scan line SL2 to the $m^{th}$ second scan line SL2 have a second gate turn-on potential according to a time sequence, and a plurality of second transistors T2 of a plurality of touch structures TS in the $1^{st}$ to $m^{th}$ horizontal rows are turned on according to the time sequence so as to detect a complete touch surface in the touch interval t2. The touch position of the touch component can be determined by using the touch signals VRL on the read-out lines RL obtained in the touch interval t2.

Figure 6:
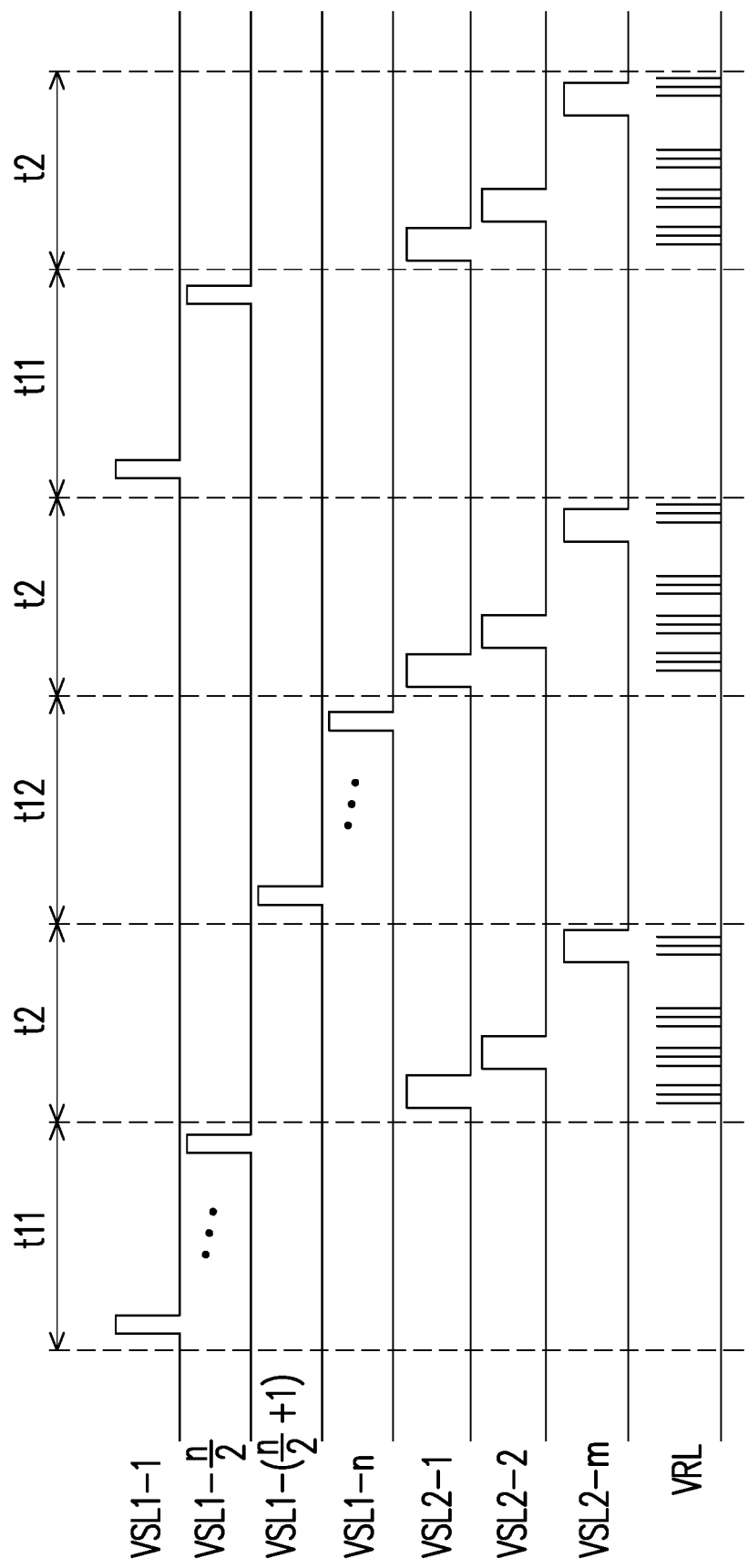
FIG. 6 shows the first scan signals $$VSL1\text{-}1 \text{ to } VSL1\text{-}\frac{n}{2}$$

FIG. 6 shows the first scan signals $$VSL1\text{-}1 \text{ to } VSL1\text{-}\frac{n}{2}$$

of the $1^{st}$ first scan line SL1 to the $$\left(\frac{n}{2}\right)^{th}$$

first scan line SL1, the first scan signals $$VSL1\text{-}\left(\frac{n}{2}+1\right)$$

to VSL1-$n$ of the $$\left(\frac{n}{2}+1\right)^{th}$$

first scan line SL1 to the $n^{th}$ first scan line SL1, the second scan signal VSL2-1 of the $1^{st}$ second scan line SL2, the second scan signal VSL2-2 of the $2^{nd}$ second scan line SL2 to the second scan signal VSL2-$m$ of the $m^{th}$ second scan line SL2, and the touch signals VRL on the read-out lines RL of touch structures TS according to another embodiment of the present disclosure.

Referring to FIG. 1, FIG. 3 and FIG. 6, in the first sub-display interval t11, the first scan signals $$VSL1\text{-}1 \text{ to } VSL1\text{-}\frac{n}{2}$$

of the $1^{st}$ first scan line SL1 to the $$\left(\frac{n}{2}\right)^{th}$$

first scan line SL1 have a first gate turn-on potential according to a time sequence, and a plurality of first transistors T1 of a plurality of pixel structures PX in the $1^{st}$ to horizontal rows are turned on according to the time sequence so as to display a first portion of a frame picture in the first sub-display interval t11. In a touch interval t2 following the first sub-display interval t11, the second scan signals VSL2-1 to VSL2-$m$ of the $1^{st}$ second scan line SL2 to the $m^{th}$ second scan line SL2 have a second gate turn-on potential according to a time sequence, and a plurality of second transistors T2 of a plurality of touch structures TS in the $1^{st}$ to $m^{th}$ horizontal rows are turned on according to the time sequence so as to detect a complete touch surface in the touch interval t2. The touch position of the touch component can be determined by using the touch signals VRL on the read-out lines RL obtained in the touch interval t2. In a second sub-display interval t12 following the touch interval t2, the first scan signals $$VSL1\text{-}\left(\frac{n}{2}+1\right)$$

to VSL1-$n$ of the $$\left(\frac{n}{2}+1\right)^{th}$$

first scan line SL1 to the $n^{th}$ first scan line SL1 have a first gate turn-on potential according to a time sequence, and a plurality of first transistors T1 of a plurality of pixel structures PX in the $$\left(\frac{n}{2}+1\right)^{th}$$

to $n^{th}$ horizontal rows are turned on according to the time sequence so as to display a second portion of a frame picture in the second sub-display interval t12. In the present embodiment, the first portion of the frame picture and the second portion of the frame picture can form a complete frame picture.

FIG. 7 shows the first scan signals VSL1-1 to VSL1-$p$ of the $1^{st}$ first scan line SL1 to the $p^{th}$ first scan line SL1, the first scan signals VSL1-($p$+1) to VSL1-2$p$ of the $(p+1)^{th}$ first scan line SL1 to the $2p^{th}$ first scan line SL1, the first scan signals VSL1-($n$−$p$+1) to VSL1-$n$ of the $(n-p+1)^{th}$ first scan line SL1 to the $n^{th}$ first scan line SL1, the second scan signals VSL2-1, VSL2-2 to VSL2-$m$ of the $1^{st}$ second scan line SL2, the $2^{nd}$ second scan line SL2 to the $m^{th}$ second scan line SL2, and the touch signals VRL on the read-out lines RL of touch structures TS according to another embodiment of the present disclosure.

In the embodiment of FIG. 7, the $1^{st}$ first scan line SL1 to the $n^{th}$ first scan line SL1 are divided into k groups, and k is a positive integer equal to or greater than 3. Each group of first scan lines SL1 comprises p first scan lines SL1, wherein p is a positive integer equal to or greater than 2 and less than n.

Referring to FIG. 1, FIG. 3 and FIG. 7, in the first sub-display interval t11, the first scan signals VSL1-1 to VSL1-$p$ of the $1^{st}$ first scan line SL1 to the $p^{th}$ first scan line SL1 have a first gate turn-on potential according to a time sequence, and the first transistors T1 of the pixel structures PX in the $1^{st}$ to $p^{th}$ horizontal rows are turned on according to the time sequence so as to display a first portion of a frame picture in the first sub-display interval t11. In a first sub-touch interval t21 following the first sub-display interval t11, the second scan signal VSL2-1 of the $1^{st}$ second scan line SL2 has a second gate turn-on potential, and a plurality of second transistors T2 of a plurality of touch structures TS in the $1^{st}$ horizontal row are turned on so as to detect a first portion of a touch surface on which the first touch electrodes 120 of the plurality of touch structures TS in the $1^{st}$ horizontal row are located in the first sub-touch interval t21. In the second sub-display interval t12 following the first sub-touch interval t21, the first scan signals VSL1-($p$+1) to VSL1-2$p$ of the $(p+1)^{th}$ first scan line SL1 to the $2p^{th}$ first scan line SL1 have a first gate turn-on potential according to a time sequence, and a plurality of first transistors T1 of a plurality of pixel structures PX in the $(p+1)^{th}$ to $2p^{th}$ horizontal rows are turned on according to the time sequence so as to display a second portion of a frame picture in the second sub-display interval t12. In the second sub-touch interval t22 following the second sub-display interval t12, the second scan signal VSL2-2 of the $2^{nd}$ second scan line SL2 has a second gate turn-on potential, and a plurality of second transistors T2 of a plurality of touch structures TS in the $2^{nd}$ horizontal row are turned on so as to detect a second portion of a touch surface on which the first touch electrodes 120 of the plurality of touch structures TS in the $2^{nd}$ horizontal row are located in the second sub-touch interval t22.

By parity of reasoning, until the last sub-display interval t1$k$, the first scan signals VSL1-($n$−$p$+1) to VSL1-$n$ of the $(n-p+1)^{th}$ first scan line SL1 to the $n^{th}$ first scan line SL1 of the last group of first scan lines have a first gate turn-on potential according to a time sequence, and a plurality of first transistors T1 of a plurality of pixel structures PX in the $(n-p+1)^{th}$ to $n^{th}$ horizontal rows are turned on according to the time sequence so as to display the last portion of a frame picture (namely the $k^{th}$ portion of a frame picture) in the last sub-display interval t1$k$. Furthermore, in the last sub-touch interval t2$k$ following the last sub-display interval t1$k$, the second scan signal VSL2-$m$ of the last second scan line SL2 has a second gate turn-on potential, and a plurality of second transistors T2 of a plurality of touch structures TS in the last horizontal row are turned on so as to detect a last portion of a touch surface on which the first touch electrodes 120 of the plurality of touch structures TS in the last horizontal row are located in the last sub-touch interval t2$k$. In the present embodiment, the first portion of the frame picture, the second portion of the frame picture to the $k^{th}$ portion of the frame picture can form a complete frame picture.

It should be noted herein that the following embodiments follow the element reference numbers and partial content of the foregoing embodiments, where same reference numbers are used to represent the same or like elements and descriptions of same technical content is omitted. Descriptions of the omitted part may refer to the foregoing embodiments and are not described in the following embodiments again.

FIG. 8 is a cross-sectional schematic view of a touch display apparatus 10A according to a second embodiment of the present disclosure. The touch display apparatus 10A in FIG. 8 is similar to the touch display apparatus 10 in FIG. 4, and the difference between the touch display apparatus 10A and the touch display apparatus 10 is as follows: the color filter layer 230 of the touch display apparatus 10A in FIG. 8 is arranged on the first substrate 110.

Referring to FIG. 8, specifically, in the present embodiment, the first touch electrode 120 is arranged on the inner surface 114 of the first substrate 110, the dielectric layer 130 is arranged on the inner surface 114 of the first substrate 110 and the first touch electrode 120, and the color filter layer 230 is arranged on the first transistor T1 and the second transistor T2. The first connecting pattern 191 is arranged on the color filter layer 230 and is electrically connected to the first touch electrode 120 through a contact 231 of the color filter layer 230, a contact 151 of the gate insulating layer 150 and a contact 131 of the dielectric layer 130.

FIG. 9 is a layout schematic view of a touch display apparatus 10B according to a third embodiment of the present disclosure. FIG. 10 is a cross-sectional schematic view of the touch display apparatus 10B according to the third embodiment of the present disclosure. FIG. 10 is corresponding to a section line A-A', a section line B-B' and a section line C-C' in FIG. 9.

The touch display apparatus 10B in FIG. 9 and FIG. 10 is similar to the touch display apparatus 10 in FIG. 3 and FIG. 4, and the difference between the touch display apparatus 10B and the touch display apparatus 10 is as follows: the read-out line RL of the touch display apparatus 10B in FIG. 9 and FIG. 10 is formed on a different film layer from the first scan line SL1, the second scan line SL2 and the data line DL. In the embodiments of FIG. 9 and FIG. 10, the first scan line SL1 and the second scan line SL2 can be formed on a first metal layer, the data line DL can be formed on a second metal layer, and the read-out line RL can be formed on another conductive layer other than the first metal layer and the second metal layer.

Referring to FIG. 9 and FIG. 10, for example, in the present embodiment, the read-out line RL is arranged on the inner surface 114 of the first substrate 110, the touch display apparatus 10B further comprises an insulating layer 195, the insulating layer 195 is arranged on the read-out line RL and the inner surface 114 of the first substrate 110, the first touch electrode 120 is arranged on the insulating layer 195, the dielectric layer 130 is arranged on the first touch electrode 120, the first transistor T1 and the second transistor T2 are arranged on the dielectric layer 130, and the insulating layer 180 is arranged on the first transistor T1 and the second transistor T2.

The touch display apparatus 10B further comprises a second connecting pattern 192 arranged on the insulating layer 180 and electrically connected to the second end 172b of the second transistor T2. The second connecting pattern 192 is electrically connected to the read-out line RL through a contact 182 of the insulating layer 180, a contact 152 of the gate insulating layer 150, a contact 132 of the dielectric layer 130 and a contact 195a of the insulating layer 195.

In the present embodiment, the second connecting pattern 192 and the pixel electrode 190 can be formed on the same film layer, the material of the second connecting pattern 192 can be the same as the material of the pixel electrode 190, but the present disclosure is not limited thereto.

FIG. 11 is a cross-sectional schematic view of a touch display apparatus 10C according to a fourth embodiment of the present disclosure. The touch display apparatus 10C in FIG. 11 is similar to the touch display apparatus 10B in FIG. 9, and the difference between the touch display apparatus 10C and the touch display apparatus 10B is as follows: the color filter layer 230 of the touch display apparatus 10C in FIG. 11 is arranged on the first substrate 110.

Referring to FIG. 11, in the present embodiment, the color filter layer 230 is arranged on the first transistor T1 and the second transistor T2. The second connecting pattern 192 is arranged on the color filter layer 230 and is electrically connected to the read-out line RL through a contact 232 of the color filter layer 230, a contact 152 of the gate insulating layer 150, a contact 132 of the dielectric layer 130 and a contact 195a of the insulating layer 195.

FIG. 12 is a schematic view of a touch display apparatus 20 according to a fifth embodiment of the present disclosure. FIG. 12 shows a first substrate 110, touch structures TS and a chip IC, and omits other components of the touch display apparatus 20.

FIG. 13 is an equivalent circuit schematic view of a plurality of touch structures TS of the touch display apparatus 20 according to the fifth embodiment of the present disclosure.

FIG. 14A and FIG. 14B are layout schematic views of the touch display apparatus 20 according to the fifth embodiment of the present disclosure. FIG. 14A and FIG. 14B are respectively corresponding to the portion R1 of FIG. 12 and the portion R2 of FIG. 12.

It should be noted that FIG. 14A and FIG. 14B show the main portion M of the first touch electrode 120 and the main portion M' of the second touch electrode 122 of FIG. 12, and omit other portions of the first touch electrode 120 of FIG. 12 and other portions of the second touch electrode 122 of FIG. 12.

FIG. 15 is a cross-sectional schematic view of the touch display apparatus 20 according to the fifth embodiment of the present disclosure. FIG. 15 is corresponding to a section line A-A', a section line B-B' and a section line D-D' in FIG. 14A and FIG. 14B.

The touch display apparatus 20 of the fifth embodiment is similar to the touch display apparatus 10 of the first embodiment, and the difference between the touch display apparatus 20 and the touch display apparatus 10 is as follows: the touch structure TS of the touch display apparatus 20 of the fifth embodiment is a mutual-capacitance touch structure.

Referring to FIG. 12, FIG. 13, FIG. 14A and FIG. 14B, specifically, the touch structure TS of the touch display apparatus 20 comprises a first touch electrode 120 and further comprises a second touch electrode 122. The first touch electrode 120 is overlapped with the pixel electrode 190 of the first pixel structure PX1. The second touch electrode 122 is overlapped with the pixel electrode 190 of the second pixel structure PX2. The first touch electrode 120 and the second touch electrode 122 of the touch structure TS form capacitance Cx (shown in FIG. 13). When the touch component approaches the first touch electrode 120, a change of the capacitance Cx is generated. The change of the capacitance Cx can be transmitted to the chip IC through the second touch electrode 122, the second transistor T2 and the read-out line RL, thereby determining the touch position of the touch component.

In the present embodiment, the second touch electrode 122 and the first touch electrode 120 can be formed on the same film layer and are separated structurally. The second touch electrode 122 is arranged on the inner surface 114 of the first substrate 110, and the second touch electrode 122 is arranged between the first substrate 110 and the dielectric layer 130. The dielectric layer 130 is arranged between the second touch electrode 122 and the first transistor T1.

In the present embodiment, the second touch electrode 122 is electrically connected to the second scan line SL2 selectively. Specifically, the touch display apparatus 20 further comprises a third connecting pattern 193 which can be arranged on the insulating layer 180 and is electrically connected to the second scan line SL2. The third connecting pattern 193 is electrically connected to the second touch electrode 122 through a contact 183 of the insulating layer 180, a contact 153 of the gate insulating layer 150 and a contact 133 of the dielectric layer 130. In other words, the second touch electrode 122 can be electrically connected to the second scan line SL2 through the third connecting pattern 193.

In the present embodiment, the third connecting pattern 193 and the pixel electrode 190 can be formed on the same film layer, the material of the third connecting pattern 193 can be the same as the material of the pixel electrode 190, but the present disclosure is not limited thereto.

FIG. 16 is a schematic view of a touch display apparatus 20A according to a sixth embodiment of the present disclosure. FIG. 16 shows a first substrate 110, touch structures TS and a chip IC, and omits other components of the touch display apparatus 20A.

FIG. 17 is an equivalent circuit schematic view of a plurality of touch structures TS of the touch display apparatus 20A according to the sixth embodiment of the present disclosure.

FIG. 18A and FIG. 18B are layout schematic views of the touch display apparatus 20A according to the sixth embodiment of the present disclosure. FIG. 18A and FIG. 18B are respectively corresponding to the portion R3 of FIG. 16 and the portion R4 of FIG. 16.

It should be noted that FIG. 18A and FIG. 18B show the main portion M of the first touch electrode 120 and the main portion M' of the second touch electrode 122 of FIG. 16, and omit other portions of the first touch electrode 120 of FIG. 16 and other portions of the second touch electrode 122 of FIG. 16.

FIG. 19 is a cross-sectional schematic view of the touch display apparatus 20A according to the sixth embodiment of the present disclosure. FIG. 19 is corresponding to a section line A-A', a section line B-B' and a section line E-E' in FIG. 18A and FIG. 18B.

The touch display apparatus 20A of the sixth embodiment is similar to the touch display apparatus 20 of the fifth embodiment, and the difference between the touch display apparatus 20A and the touch display apparatus 20 is as follows: the touch display apparatus 20A of the sixth embodiment further comprises a control line TL.

Referring to FIG. 16, FIG. 17, FIG. 18A, FIG. 18B and FIG. 19, in the present embodiment, the control line TL and the second scan line SL2 are selectively formed on the same film layer and are separated structurally. The data line DL and the read-out line RL are arranged in a first direction x, the first scan line SL1, the second scan line SL2 and the control line TL are arranged in a second direction y, and the first direction x and the second direction y are staggered. In the present embodiment, the second touch electrode 122 is electrically connected to the control line TL instead of being electrically connected to the second scan line SL2.

The touch display apparatus 20A further comprises a fourth connecting pattern 194 arranged on the insulating layer 180 and electrically connected to the control line TL. The fourth connecting pattern 194 is electrically connected to the second touch electrode 122 through a contact 184 of the insulating layer 180, a contact 154 of the gate insulating layer 150 and a contact 134 of the dielectric layer 130. In other words, the second touch electrode 122 can be electrically connected to the control line TL through the fourth connecting pattern 194.

In the present embodiment, the fourth connecting pattern 194 and the pixel electrode 190 can be formed on the same film layer, the material of the fourth connecting pattern 194 can be the same as the material of the pixel electrode 190, but the present disclosure is not limited thereto.

FIG. 20 is a cross-sectional schematic view of a touch display apparatus 30 according to a seventh embodiment of the present disclosure. The touch display apparatus 30 in FIG. 20 is similar to the touch display apparatus 10 in FIG. 4, and the difference between the touch display apparatus 30 and the touch display apparatus 10 is as follows: in the embodiment of FIG. 20, the touch structure TS is also arranged on the inner surface 114 of the first substrate 110, but the pixel structure PX is arranged on the second substrate 210. Referring to FIG. 20, in the present embodiment, the second transistor T2 of the touch structure TS is overlapped with the first transistor T1 of the pixel structure PX in a vertical projection direction z, but the present disclosure is not limited thereto.

FIG. 21 is a cross-sectional schematic view of a touch display apparatus 30A according to an eighth embodiment of the present disclosure. The touch display apparatus 30A in FIG. 21 is similar to the touch display apparatus 30 in FIG. 20, and the difference between the touch display apparatus 30A and the touch display apparatus 30 is as follows: in the embodiment of FIG. 20, the shading pattern 220 is arranged between the first substrate 110 and the second transistor T2 of the touch structure TS. In the embodiment of FIG. 21, the second transistor T2 is arranged between the first substrate 110 and the shading pattern 220.

Furthermore, in each of the above embodiments, the control end 141, the control end 142, the first end 171$a$, the first end 172$a$, the second end 171$b$, the second end 172$b$, the data line DL, the read-out line RL, the first scan line SL1, the second scan line SL2 and/or the control line TL can comprise a blackening layer, such as $MoTaO_x$, so as to reduce the reflectivity and improve the display effect, but the present disclosure is not limited thereto.

Although the disclosure is described with reference to the above embodiments, the embodiments are not intended to limit the disclosure. A person of ordinary skill in the art may make variations and modifications without departing from the spirit and scope of the disclosure. Therefore, the protection scope of the disclosure should be subject to the appended claims.

What is claimed is:

1. A touch display apparatus, comprising:
    a first substrate provided with an outer surface and an inner surface opposite to each other, wherein the outer surface is a touch surface;
    a second substrate arranged opposite to the first substrate;
    a display medium arranged between the inner surface of the first substrate and the second substrate;
    a plurality of pixel structures arranged between the first substrate and the display medium or between the second substrate and the display medium, wherein each of the pixel structures comprises a data line, a first scan line, a first transistor and a pixel electrode, the first transistor is provided with a first end, a second end and a control end, the data line is electrically connected to the first end of the first transistor, the first scan line is electrically connected to the control end of the first transistor, and the pixel electrode is electrically connected to the second end of the first transistor;
    a first touch electrode arranged on the inner surface of the first substrate;
    a second transistor arranged on the inner surface of the first substrate and provided with a first end, a second end and a control end;

a read-out line and a second scan line arranged on the inner surface of the first substrate, wherein the read-out line is electrically connected to the first end of the second transistor, the second scan line is electrically connected to the control end of the second transistor, the first touch electrode is electrically connected to the second end of the second transistor, and the first touch electrode is overlapped with a pixel electrode of a first pixel structure of the pixel structures; and a dielectric layer, wherein the first touch electrode is arranged between the first substrate and the dielectric layer, and the dielectric layer is arranged between the first touch electrode and a first transistor of the first pixel structure.

2. The touch display apparatus according to claim 1, wherein the dielectric layer is arranged on the first touch electrode, and the first transistor of the first pixel structure is arranged on the dielectric layer.

3. The touch display apparatus according to claim 1, wherein the dielectric layer is arranged on the first touch electrode, and the second transistor is arranged on the dielectric layer.

4. The touch display apparatus according to claim 3, further comprising:
a first connecting pattern electrically connected to the second end of the second transistor, wherein the first connecting pattern is electrically connected to the first touch electrode through a contact of the dielectric layer.

5. The touch display apparatus according to claim 4, further comprising:
an insulating layer arranged on the second transistor, wherein the first connecting pattern is arranged on the insulating layer and is electrically connected to the first touch electrode through a contact of the insulating layer.

6. The touch display apparatus according to claim 4, further comprising:
a color filter layer arranged on the dielectric layer and the second transistor, wherein the first connecting pattern is arranged on the color filter layer and is electrically connected to the first touch electrode through a contact of the color filter layer.

7. The touch display apparatus according to claim 4, wherein a material of the first connecting pattern is the same as a material of the pixel electrode of the first pixel structure.

8. The touch display apparatus according to claim 1, wherein the dielectric layer is arranged on the read-out line, and the touch display apparatus further comprises:
a second connecting pattern arranged on the dielectric layer, electrically connected to the second end of the second transistor, and electrically connected to the read-out line through a contact of the dielectric layer.

9. The touch display apparatus according to claim 8, further comprising:
an insulating layer arranged on the dielectric layer and the second transistor, wherein the second connecting pattern is arranged on the insulating layer and is electrically connected to the read-out line through a contact of the insulating layer.

10. The touch display apparatus according to claim 8, further comprising:
a color filter layer arranged on the dielectric layer and the second transistor, wherein the second connecting pattern is arranged on the color filter layer and is electrically connected to the read-out line through a contact of the color filter layer.

11. The touch display apparatus according to claim 8, wherein a material of the second connecting pattern is the same as a material of the pixel electrode of the first pixel structure.

12. The touch display apparatus according to claim 1, wherein a data line of the first pixel structure and the read-out line are arranged in a first direction, a first scan line of the first pixel structure and the second scan line are arranged in a second direction, and the first direction and the second direction are staggered.

13. The touch display apparatus according to claim 1, wherein a data line of the first pixel structure is substantially parallel to the read-out line.

14. The touch display apparatus according to claim 1, wherein a first scan line of the first pixel structure is substantially parallel to the second scan line.

15. The touch display apparatus according to claim 1, wherein the read-out line spans a central part of the pixel electrode of the first pixel structure.

16. The touch display apparatus according to claim 1, wherein the pixel electrode of the first pixel structure comprises a first main part, a second main part and a plurality of branch parts, the first main part and the second main part are staggered, the branch parts are connected to the first main part and the second main part, and the read-out line is overlapped with the first main part of the pixel electrode.

17. The touch display apparatus according to claim 1, wherein a vertical projection of a first scan line of the first pixel structure on the first substrate and a vertical projection of the second scan line on the first substrate are respectively positioned at two opposite sides of a vertical projection of the pixel electrode of the first pixel structure on the first substrate.

18. The touch display apparatus according to claim 1, further comprising:
a second touch electrode arranged on the inner surface of the first substrate, wherein the pixel structures comprise a second pixel structure, the second touch electrode is overlapped with a pixel electrode of the second pixel structure, the second touch electrode is arranged between the first substrate and the dielectric layer, the dielectric layer is arranged between the second touch electrode and the first transistor of the first pixel structure, and the second touch electrode is electrically connected to the second scan line.

19. The touch display apparatus according to claim 18, further comprising:
a third connecting pattern electrically connected to the second scan line, wherein the third connecting pattern is electrically connected to the second touch electrode through a contact of the dielectric layer.

20. The touch display apparatus according to claim 19, further comprising:
an insulating layer arranged on the dielectric layer and the second transistor, wherein the third connecting pattern is arranged on the insulating layer and is electrically connected to the second touch electrode through a contact of the insulating layer.

21. The touch display apparatus according to claim 19, wherein a material of the third connecting pattern is the same as a material of the pixel electrode of the first pixel structure.

22. The touch display apparatus according to claim 1, further comprising:
a second touch electrode arranged on the inner surface of the first substrate, wherein the pixel structures comprise a second pixel structure, the second touch electrode is overlapped with a pixel electrode of the second pixel structure, the second touch electrode is arranged between the first substrate and the dielectric layer, and the dielectric layer is arranged between the second touch electrode and the first transistor of the first pixel structure; and a control line, wherein the second touch electrode is electrically connected to the control line.

23. The touch display apparatus according to claim 22, further comprising:

a fourth connecting pattern electrically connected to the control line, wherein the fourth connecting pattern is electrically connected to the second touch electrode through a contact of the dielectric layer.

24. The touch display apparatus according to claim 23, further comprising:

an insulating layer arranged on the dielectric layer and the second transistor, wherein the fourth connecting pattern is arranged on the insulating layer and is electrically connected to the second touch electrode through a contact of the insulating layer.

25. The touch display apparatus according to claim 23, wherein a material of the fourth connecting pattern is the same as a material of the pixel electrode of the first pixel structure.

26. The touch display apparatus according to claim 22, wherein a plurality of data lines of the pixel structures and the read-out line are arranged in a first direction, a plurality of first scan lines of the pixel structures, the second scan line and the control line are arranged in a second direction, and the first direction and the second direction are staggered.

* * * * *